(12) United States Patent
Hush

(10) Patent No.: US 10,090,041 B2
(45) Date of Patent: *Oct. 2, 2018

(54) PERFORMING LOGICAL OPERATIONS USING SENSING CIRCUITRY

(71) Applicant: Micron Technology, Inc., Boise, ID (US)

(72) Inventor: Glen E. Hush, Boise, ID (US)

(73) Assignee: Micro Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/680,776

(22) Filed: Aug. 18, 2017

(65) Prior Publication Data

US 2017/0345481 A1  Nov. 30, 2017

Related U.S. Application Data

(63) Continuation of application No. 15/261,645, filed on Sep. 9, 2016, now Pat. No. 9,741,427, which is a
(Continued)

(51) Int. Cl.
*G11C 7/00* (2006.01)
*G11C 11/4091* (2006.01)
(Continued)

(52) U.S. Cl.
CPC .......... *G11C 11/4091* (2013.01); *G11C 7/065* (2013.01); *G11C 7/1006* (2013.01);
(Continued)

(58) Field of Classification Search
CPC ............ G11C 11/4091; G11C 11/4087; G11C 11/4093; G11C 7/065; G11C 7/1012; G11C 7/1006
See application file for complete search history.

(56) References Cited

U.S. PATENT DOCUMENTS 4,380,046 A   4/1983   Fung
4,435,792 A   3/1984   Bechtolsheim
(Continued)

FOREIGN PATENT DOCUMENTS

CN   102141905   8/2011
EP   0209050    1/1987
(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Pho M Luu
(74) *Attorney, Agent, or Firm* — Brooks, Cameron & Huebsch, PLLC

(57) ABSTRACT

Apparatuses and methods related to performing logical operations using sensing circuitry are provided. One apparatus comprises an array of memory cells, sensing circuitry coupled to the array of memory cells via a sense line, and a controller coupled to the array of memory cells and the sensing circuitry. The sensing circuitry includes a sense amplifier and does not include an accumulator. The controller is configured to perform logical operations using the array of memory cells as an accumulator without transferring data out of the memory array and sensing circuitry.

20 Claims, 8 Drawing Sheets

Related U.S. Application Data continuation of application No. 14/721,086, filed on May 26, 2015, now Pat. No. 9,449,674.

(60) Provisional application No. 62/008,041, filed on Jun. 5, 2014.

(51) Int. Cl.
  *G11C 7/06* (2006.01)
  *G11C 7/10* (2006.01)
  *G11C 11/4093* (2006.01)
  *G11C 11/408* (2006.01)

(52) U.S. Cl.
  CPC ........ *G11C 7/1012* (2013.01); *G11C 11/4087* (2013.01); *G11C 11/4093* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,831,591 A | 5/1989 | Imazeki et al. |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,889,699 A | 3/1999 | Takano |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |

(56) References Cited

U.S. PATENT DOCUMENTS

| | | | |
|---|---|---|---|
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,760,958 B2 | 6/2014 | Iyer | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 9,412,425 B2 | 8/2016 | Lin et al. | |
| 9,449,674 B2 * | 9/2016 | Hush | G11C 11/4091 |
| 9,455,029 B2 * | 9/2016 | Filipiak | G11C 29/42 |
| 9,472,298 B1 * | 10/2016 | Louie | G11C 16/28 |
| 9,741,427 B2 * | 8/2017 | Hush | G11C 11/4091 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

(56) References Cited

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion from related international application No. PCT/US2015/034105, dated Sep. 8, 2015 11 pp.

European Search Report and Written Opinion for related EP Application No. 15803466.0, dated Jan. 4, 2018, 9 pages.

Notice of Rejection for related Korea Patent Application No. 10-2017-7000075, dated May 11, 2018, 9 pages.

* cited by examiner

PERFORMING LOGICAL OPERATIONS USING SENSING CIRCUITRY

PRIORITY INFORMATION

This application is a Continuation of U.S. application Ser. No. 15/261,645, filed Sep. 9, 2016, which will issue as U.S. Pat. No. 9,741,427 on Aug. 22, 2017, which is a Continuation of U.S. application Ser. No. 14/721,086, which issued as U.S. Pat. No. 9,449,674 on Sep. 20, 2016, which claims the benefit of U.S. Provisional Application No. 62/008,041, filed Jun. 5, 2014, the contents of which are incorporated herein by reference.

TECHNICAL FIELD

The present disclosure relates generally to semiconductor memory and methods, and more particularly, to apparatuses and methods related to performing logical operations using sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAIVI), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry (FUC) may be used to perform arithmetic operations such as addition, subtraction, multiplication, and/or division on operands via a number of logical operations.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may conserve time and power in processing. However, such PIM devices may have various drawbacks such as an increased chip size. Moreover, such PIM devices may still consume undesirable amounts of power in association with performing logical operations (e.g., compute functions).

DETAILED DESCRIPTION

Figure 1:
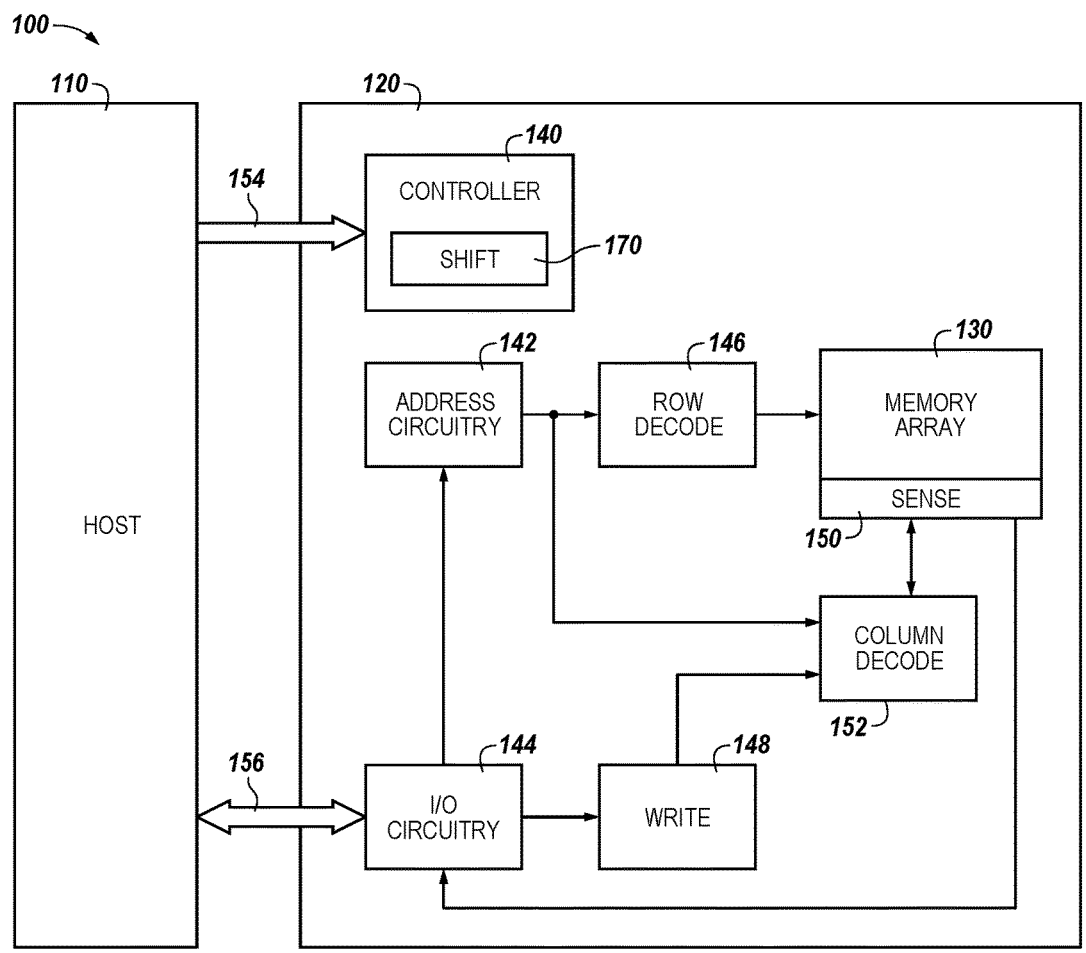
FIG. 1 is a block diagram of an apparatus in the form of a computing system including a memory device in accordance with a number of embodiments of the present disclosure.

The present disclosure includes apparatuses and methods related to performing logical operations using sensing circuitry. An example apparatus comprises an array of memory cells, sensing circuitry coupled to the array of memory cells via a sense line, and a controller coupled to the array of memory cells and the sensing circuitry. The sensing circuitry includes a sense amplifier and does not include an accumulator. The controller is configured to perform logical operations using the array of memory cells as an accumulator without transferring data out of the memory array and sensing circuitry.

A number of embodiments of the present disclosure can provide improved parallelism and/or reduced power consumption in association with performing compute functions as compared to previous systems such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array.

For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with memory cells of the array and capable of performing compute functions such as those described herein below.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines. Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

The controller 140 can include a shift controller 170 that can control signals provided to, for instance, shift circuitry in association with performing data shifting as described further herein. For example, the shift controller 170 can control shifting data (e.g., right or left) in an array.

Examples of the sensing circuitry 150 are described further below. For instance, in a number of embodiments, the sensing circuitry 150 can comprise a number of sense amplifiers (e.g., sense amplifier 206 shown in FIG. 2 or sense amplifier 706 shown in FIG. 7) and a number of compute components (e.g., compute component 231-1 shown in FIG. 2), which may comprise an accumulator and can be used to perform logical operations (e.g., on data associated with complementary data lines).

In a number of embodiments, the sensing circuitry (e.g., 150) can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on control circuitry 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry (e.g., 150) is configured to perform logical operations on data stored in memory (e.g., array 130) and store the result back to the memory without enabling an I/O line (e.g., a local I/O line) coupled to the sensing circuitry, which can be formed on pitch with the memory cells of the array. Enabling an I/O line can include enabling (e.g., turning on) a transistor having a gate coupled to a decode signal (e.g., a column decode signal) and a source/drain coupled to the I/O line. Embodiments are not so limited. For instance, in a number of embodiments, the sensing circuitry (e.g., 150) can be used to perform logical operations without enabling column decode lines of the array; however, the local I/O line(s) may be enabled in order to transfer a result to a suitable location other than back to the array (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth of such an external processing resource). However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Figure 2:
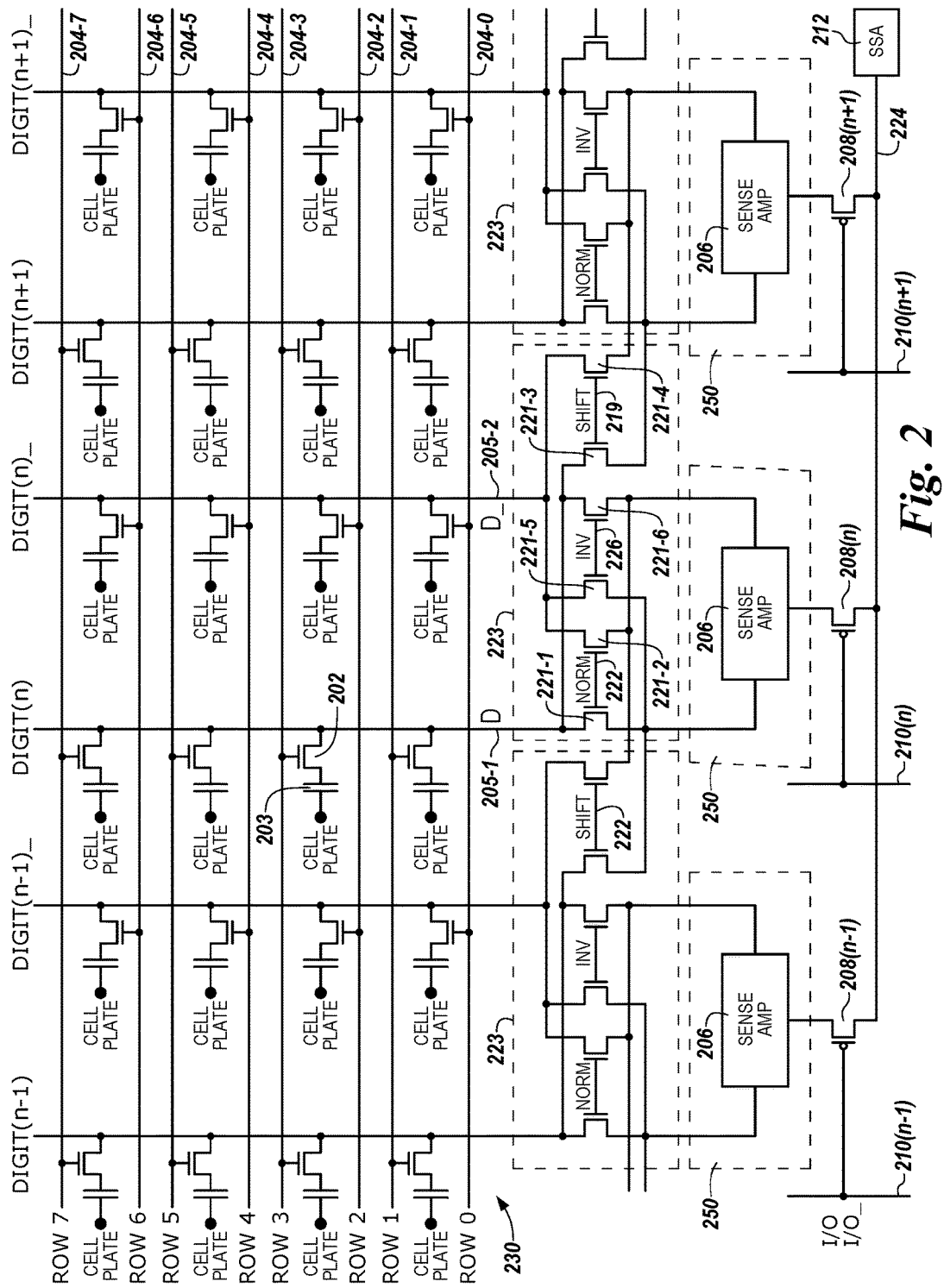
FIG. 2 is a schematic diagram illustrating memory cells and sensing circuitry in accordance with a number of embodiments of the present disclosure.

FIG. 2 is a schematic diagram illustrating sensing circuitry in accordance with a number of embodiments of the present disclosure. In this example, the memory array 230 is a DRAM array of 1T1C (one transistor one capacitor) memory cells each comprised of an access device 202 (e.g., transistor) and a storage element 203 (e.g., a capacitor). In a number of embodiments, the memory cells may be destructive read memory cells (e.g., reading the data stored in the cell destroys the data such that the data originally stored in the cell is refreshed after being read). The cells of the memory array 230 are arranged in rows coupled by word lines 204-0 (Row 0), 204-1 (Row 1), etc. and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pair of complementary data lines are shown in FIG. 2, embodiments of the present disclosure are not so limited, and an array of memory cells can include additional columns of memory cells and/or data lines (e.g., 4,096, 8,192, 16,384, etc.).

As shown in FIG. 2, a gate of a particular memory cell transistor 202 can be coupled to its corresponding word line 204-0, 204-1, . . . , 204-7, etc. A first source/drain region can be coupled to its corresponding data line (e.g., 205-1 (D), 205-2 (D_)), and a second source/drain region of a particular memory cell transistor 202 can be coupled to its corresponding capacitor 203.

The memory array 230 is coupled to sensing circuitry 250 in accordance with a number of embodiments of the present disclosure. In this example, the sensing circuitry 250 comprises a sense amplifier 206 corresponding to respective columns of memory cells (e.g., coupled to respective pairs of complementary data lines 205-1 (D) and 205-2 (D_)) but may, or may not, additionally comprise a compute component. The sensing circuitry can correspond to sensing circuitry 150 shown in FIG. 1, for example.

In the example illustrated in FIG. 2, the sensing circuitry 250 comprises a sense amplifier 206. An example configuration for sense amplifier 206 is described in detail with respect to FIG. 3 below. In a number of embodiments, a sense amplifier 206 (e.g., "sense amp") is provided for each column of memory cells in an array (e.g., array 130). The sense amplifier 206 can be sense amplifier of a DRAM array, for instance. In this example, sense amplifier 206 is coupled to a pair of complementary data lines 205-1 (D) and 205-2 (D_). As such, the sense amplifier 206 can be coupled to all of the memory cells in a respective column through data lines 205-1 (D) and 205-2 (D_).

As shown in FIG. 2, sensing circuitry 250 can be coupled to the memory array 230 via shift circuitry 223. In this example, the shift circuitry 223 comprises a pair of isolation transistors 221-1 and 221-2 coupled intermediate within the data lines 205-1 (D) and 205-2 (D_). That is, a first source/drain region of isolation transistor 221-1 can be coupled to a first portion of data line 205-1 (D) and a second source/drain region of isolation transistor 221-1 can be coupled to a second portion of data line 205-1 (D). Isolation transistor 221-2 can be similarly coupled between portions of data line 205-2 (D_).

Gates of the isolation transistors 221-1 and 221-2 are coupled to a control signal line 222 providing a normal configuration control signal (e.g., "NORM") that, when activated, enables (e.g., turns on) the isolation transistors 221-1 and 221-2 to couple the corresponding sense amplifier 206 to a column of memory cells coupled to the pair of complementary data lines 205-1 (D) and 205-2 (D_). According to various embodiments, isolation transistors 221-1 and 221-2 coupling memory cells to a particular sense amplifier 206 can be referred to as a "normal" configuration of the shift circuitry 223. Isolation transistors 221-1 and 221-2 can be used when transferring data values to/from memory cells coupled to data lines 205-1 (D) and 205-2 (D_) and the corresponding sense amplifier 206 (e.g., coupled to the date lines 205-1 (D) and 205-2 (D_) via isolation transistors 221-1 and 221-2).

In the example illustrated in FIG. 2, the shift circuitry 223 also includes another (e.g., a second) pair of isolation transistors 221-3 and 221-4 coupled between a sense amplifier 206 and an adjacent pair of complementary data lines 205-1 (D) and 205-2 (D_). As shown in FIG. 2, isolation transistors 221-3 and 221-4 are configured to couple the pair of complementary data lines 205-1 (D) and 205-2 (D_) (e.g., DIGIT(n)/DIGIT(n) _ to an adjacent sense amplifier 206. Isolation transistors 221-3 and 221-4 may also be described as being configured to couple a sense amplifier 206 (e.g., corresponding to the pair of complementary data lines 205-1 (D) and 205-2 (D_) such as DIGIT(n)/DIGIT(n)_) to an adjacent pair of complementary data lines 205-1 (D) and 205-2 (D_) (e.g., DIGIT(n–1)/DIGIT(n–1)_).

Isolation transistors 221-3 and 221-4 are configured to couple the adjacent pair of complementary data lines from one side of isolation transistors 221-1 and 221-2 (e.g., a portion of the adjacent pair of complementary data lines 205-1 (D) and 205-2 to which memory cells are coupled) to an opposite side of isolation transistors 221-1 and 221-2 of a different shift circuitry 223 coupled to the pair of complementary data lines 205-1 (D) and 205-2 (e.g., a portion of the pair of complementary data lines 205-1 (D) and 205-2 to which sense amplifier 206 is coupled). For example, isolation transistors 221-3 and 221-4 couple data lines Digit(n) and Digit (n)_ on the memory array 230 side of isolation transistors 221-1 and 221-2 to the sense amplifier 206 corresponding to data lines Digit(n+1) and Digit (n+1) _ (e.g., the right-most sense amplifier 206 shown in FIG. 2). The gates of isolation transistors 221-3 and 221-4 can be coupled to a control signal line 219 providing a shift control signal (e.g., "SHIFT"), which can be activated, for example, when the NORM control signal 222 is deactivated.

This configuration facilitates shifting data right or left. To shift data right for example, data from memory cell coupled to data lines Digit(n) and Digit (n)_ can be communicated to the right-most sense amplifier 206 shown in FIG. 2 by turning-on shift isolation transistors 221-3 and 221-4 between the right-most sense amplifier 206 shown in FIG. 2 and data lines Digit(n+1) and Digit (n+1)_. The normal isolation transistors 221-1 and 221-2 between the center sense amplifier 206 shown in FIG. 2 and data lines Digit(n) and Digit (n)_ are turned-off, and the normal isolation transistors between the right-most sense amplifier 206 shown in FIG. 2 and data lines Digit(n+1) and Digit (n+1) _ are also turned-off. Firing the right-most sense amplifier shown in FIG. 2 can load the data from data lines Digit(n) and Digit (n)_ into the right-most sense amplifier shown in FIG. 2.

This right-shifted data can subsequently be transferred to memory cells coupled to data lines Digit(n+1) and Digit (n+1) _ by turning-off shift isolation transistors 221-3 and 221-4 and turning-on the normal isolation transistors between the right-most sense amplifier shown in FIG. 2 and data lines Digit(n+1) and Digit (n+1)_.

To shift data left for example, data from memory cell coupled to data lines Digit(n) and Digit (n)_ can first be communicated to the center sense amplifier 206 shown in FIG. 2 by turning-on the normal isolation transistors 221-1 and 221-2 between the center sense amplifier 206 shown in FIG. 2 and data lines Digit(n) and Digit (n)_, and subsequently firing the center sense amplifier 206 shown in FIG. 2 to load the data into the center sense amplifier 206 shown in FIG. 2. The normal isolation transistors 221-1 and 221-2 between the center sense amplifier 206 shown in FIG. 2 and data lines Digit(n) and Digit (n)_ can be turned-off, and the shift isolation transistors between the center sense amplifier 206 shown in FIG. 2 and data lines Digit(n–1) and Digit (n–1)_ can be turned-on (with the normal isolation transistors between the left-most sense amplifier 206 shown in FIG. 2 and data lines Digit(n–1) and Digit (n–1)_ being turned-off). Data from the center sense amplifier 206 shown in FIG. 2 can be loaded into memory cells coupled to data lines Digit(n–1) and Digit (n–1)_ by enabling a desired row of memory cell coupled to data lines Digit(n–1) and Digit (n–1)_.

Figure 3:
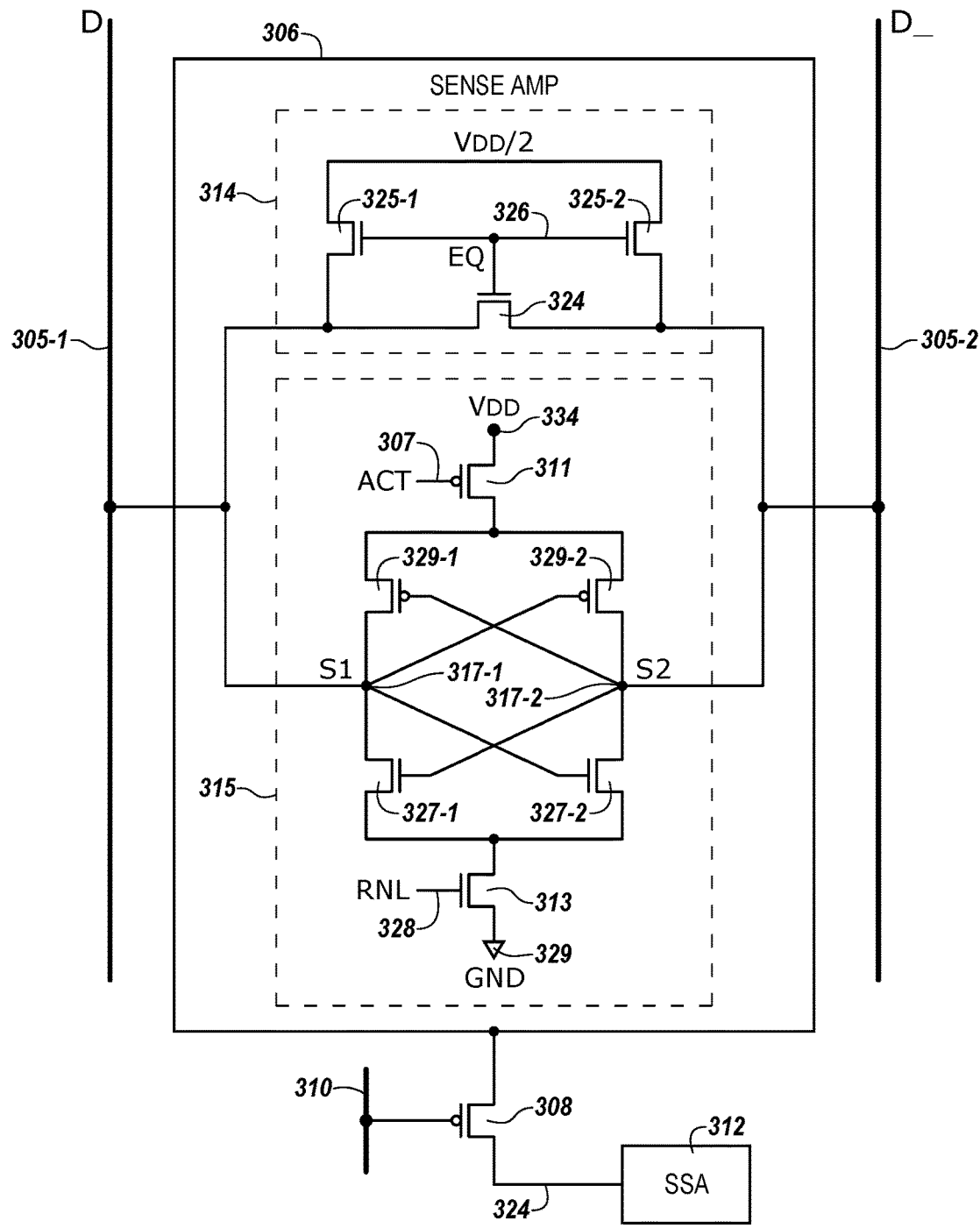
FIG. 3 is a schematic diagram illustrating a portion of sensing circuitry in accordance with a number of embodiments of the present disclosure.

Although shift circuitry 223 shown in FIG. 2 is configured such that isolation transistors 221-3 and 221-4 couple a pair of complementary data lines 205-1 (D) and 205 (D_) to a right adjacent sense amplifier 206 (e.g., or coupled a sense amplifier to a left adjacent pair of complementary data lines 205-1 (D) and 205-2 (D_)), embodiments of the present disclosure are not limited to the particular configuration illustrated in FIG. 3. For instance, isolation transistors 221-3 and 221-4 can be configured to couple a pair of complementary data lines 205-1 (D) and 205-2 (D_) to a left adjacent sense amplifier 206 (e.g., or coupled a sense amplifier to a right adjacent pair of complementary data lines 205-1 (D) and 205 (D_)). According to some embodiments of the present disclosure, isolation transistors 221-3 and 221-4 can be configured to couple a pair of complementary data lines 205-1 (D) and 205-2 (D_) to a sense amplifier 206 that is non-adjacent (e.g., a different sense amplifier 306 than to which isolation transistors 221-1 and 221-2 couple the pair of complementary data lines 205-1 (D) and 205-2 (D_)).

In the example illustrated in FIG. 2, the shift circuitry 223 further includes another (e.g., a third) pair of isolation transistors 221-5 and 221-6 coupled between a sense amplifier 206 and the corresponding pair of complementary data lines 205-1 (D) and 205-2 (D_) (e.g., the pair of complementary data lines 205-1 (D) and 205-2 (D_) to which isolation transistors 221-1 and 221-2 couple a particular sense amplifier 206. However, isolation transistors 221-5 and 221-6 are configured to couple the pair of complementary data lines 205-1 (D) and 205-2 (D_) to the sense amplifier 206 in an opposite orientation than the orientation in which isolation transistors isolation transistors 221-1 and 221-2 couple the pair of complementary data lines 205-1 (D) and 205-2 (D_) to the sense amplifier 206. Isolation transistors 221-5 and 221-6 transpose the pair of complementary data lines 205-1 (D) and 205-2 (D_) in coupling to the sense amplifier 206.

That is, isolation transistor 221-1 and 221-2 can be configured to couple data line 205-1 (D) to node Si of the primary latch 217-1 and to couple data line 205-2 (D_) to node S2 of the primary latch 217-2, and isolation transistors 221-5 and 221-6 can be configured to couple data line 205-1 (D) to node S2 of the primary latch 217-2 and to couple data line 205-2 (D_) to node Si of the primary latch 217-1). As such, isolation transistors 221-5 and 221-6 are configured to invert the pair of complementary data lines 205-1 (D) and 205-2 (D_) to the primary latch 215 of the sense amplifier 206. The gates of isolation transistors 221-5 and 221-6 can be coupled to a control signal line 226 providing an invert control signal (e.g., "INV"), which can be activated, for example, when the NORM control signal 222 is deactivated.

Isolation transistors 221-5 and 221-6 can be operated to invert and/or store an inverted data value in the primary latch of the sense amplifier 206.

The shift circuitry 223 is effectively configured as a 3-to-1 multiplexer being able to couple a compute component 250 to one of three possible data line configurations (e.g., normal coupling to a corresponding pair of complementary data lines via a first pair of isolation transistors, shift coupling to an adjacent pair of complementary data lines via a second pair of isolation transistors, and inverted coupling to transposed arrangement of the corresponding pair of complementary data lines via a third pair of isolation transistors).

Embodiments of the present disclosure are not limited to the configuration of shift circuitry 223 shown in FIG. 2. In a number of embodiments, shift circuitry 223 such as that shown in FIG. 2 can be operated (e.g., in conjunction with sense amplifiers 206) in association with performing compute functions such as adding and subtracting functions without transferring data out of the sensing circuitry via an I/O line (e.g., local IO/IO_ lines), for instance.

Each column of memory cells can be coupled to a column decode line that can be enabled to transfer, via local I/O line, a data value from a corresponding sense amplifier 206 to a control component external to the array such as an external processing resource (e.g., host processor and/or other functional unit circuitry). For example, data lines 205-1 (D) and 205-2 (D_) can be coupled to respective local I/O lines (e.g., I/O line 624) that are responsive to an enabling signal on lines 210(n−1), 210(n), 210(n+1), etc., respectively, to access transistors 208(n−1), 208(n), 208(n+1), etc., respectively, to perform an operation such as a data line access in association with a read operation. Such an enabling signal can be activated to transfer a signal corresponding to the state (e.g., a logic data value such as logic "0" or logic "1") of the memory cell being accessed out of the array on the I/O line 224 to a secondary sense amplifier (SSA) 212 and/or elsewhere off-pitch from the array 230.

Also, the column decode line can be coupled to a column decoder (e.g., column decoder 152 shown in FIG. 1). However, as described herein, in a number of embodiments, data need not be transferred via such I/O lines to perform logical operations in accordance with embodiments of the present disclosure. In a number of embodiments, shift circuitry 223 such as that shown in FIG. 2 can be operated (e.g., in conjunction with sense amplifiers 206) in performing compute functions such as adding and subtracting functions without transferring data to a control component external to the array, for instance.

The sense amplifier 206 can be operated to determine a data value (e.g., logic state) stored in a selected memory cell and/or represented by the voltages present on the complementary data lines 205-1 (D), 205-2 (D_). The sense amplifier 206 can also be utilizing in conjunction with the memory array 230 to perform logical functions, as is described with respect to FIG. 4.

Embodiments of sense amplifier 206 are not limited to the example sense amplifier 206, and can be, for example, a current-mode sense amplifier and/or single-ended sense amplifier (e.g., sense amplifier coupled to one data line). Also, embodiments of the present disclosure are not limited to a folded data line architecture. In a number of embodiments, the sense amplifier 206 can be operated to perform a logical operation using the equilibration circuitry, and/or in conjunction with invert circuitry, with the result being stored in the primary latch without transferring data from the sensing circuitry via an I/O line (e.g., without performing a data line address access via activation of a column decode signal, for instance).

FIG. 3 is a schematic diagram illustrating a portion of sensing circuitry in accordance with a number of embodiments of the present disclosure. FIG. 3 shows a sense amplifier 306 coupled to a pair of complementary data lines 305-1 (D) and 305-2 (D_). Sense amplifier 306 illustrated in FIG. 3 can correspond to sense amplifier 206 shown in FIG. 2; data line 305-1 (D) shown in FIG. 3 can correspond to data line 205-1 (D) shown in FIG. 2; and data line 305-2 (D_) shown in FIG. 3 can correspond to data line 205-2 (D_) shown in FIG. 2.

The sense amplifier 306 can include equilibration circuitry 314 and a latch 315 (e.g., a static latch such as a cross coupled latch). As used herein, the cross coupled latch of sense amplifier 306 may be referred to as a primary latch 315. The latch 315 can include a pair of cross coupled n-channel transistors (e.g., NMOS transistor) 327-1 and 327-2 having their respective sources selectively coupled to a reference voltage (e.g., ground) through a sink transistor 313. Sink transistor 313 can be an n-channel transistor (e.g., NMOS transistors), for example. A gate of the sink transistor 313 can be coupled to a negative control signal line 328 providing a negative control signal (e.g., RNL). The cross coupled n-channel transistor 327-1 can have a drain directly coupled to a first latch node 317-1 (S1), and cross coupled n-channel transistor 327-2 can have a drain directly coupled to a second latch node 317-2 (S2). The first latch node 317-1 (S1) is coupled to data line 305-1 (D), and the second latch node 317-2 (S2) is coupled to data line 305-2 (D_).

The latch 315 can also include a pair of cross coupled p-channel transistors (e.g., PMOS transistors) 329-1 and 329-2 having their respective sources selectively coupled to a supply voltage (e.g., $V_{DD}$) 334 through a source transistor 311. Source transistor 311 can be a p-channel transistor (e.g., PMOS transistor), for example. A gate of the source transistor 311 can be coupled to a positive control signal line 307 providing a positive control signal (e.g., ACT). Cross coupled p-channel transistor 329-1 can have a drain directly coupled to the first latch node 317-1 (S1), and cross coupled p-channel transistor 329-2 can have a drain directly coupled to the second latch node 317-2 (S2).

A gate of cross coupled n-channel transistor 327-1 and a gate of cross coupled p-channel transistor 329-1 are coupled to the second latch node 317-2 (S2). A gate of cross coupled n-channel transistor 327-2 and a gate of cross coupled p-channel transistor 329-2 are coupled to the second latch node 317-1 (S1).

Equilibration circuitry 314 can be configured to equilibrate the data lines 305-1 (D) and 305-2 (D_). In this example, the equilibration circuitry 314 comprises a transistor 324 coupled between data lines 305-1 (D) and 305-2 (D_). The equilibration circuitry 314 also comprises transistors 325-1 and 325-2 each having a first source/drain region coupled together. A second source/drain region of transistor 325-1 can be coupled data line 305-1 (D), and a second source/drain region of transistor 325-2 can be coupled data line 305-2 (D_). Gates of transistors 324, 325-1, and 325-2 can be coupled together, and coupled to an equilibration control signal line 326 providing an equilibration control signal (EQ). As such, activating EQ turns-on transistors 324, 325-1, and 325-2, which effectively shorts data lines 305-1 (D) and 305-2 (D_) together and to the an equilibration voltage (e.g., $V_{DD}/2$).

According to various embodiments, transistors 324, 325-1, 325-2, and an equilibration transistor are n-channel transistors. However, embodiments of the present invention are not limited to the transistors of the particular conductivity type provided in this example configuration. For example, opposite control signals can be used with transistors of opposite conductivity type to implement same sense amplifier functionality.

The sense amplifier 306 can also include additional transistors used to interface with the memory array in conventional ways, such as transistors having gates coupled to a column decode signal or a column select signal. And the data lines 305-1 (D) and 305-2 (D_) can be coupled to respective local I/O lines (e.g., I/O line 324) that are responsive to an enabling signal on line 310 to a gate of an access transistor 308 to perform an operation such as a data line access in association with a read operation. Such an enabling signal can be activated to transfer a signal corresponding to the state (e.g., a logic data value such as logic "0" or logic "1") of the memory cell being accessed out of the array on the I/O line 324 to a secondary sense amplifier (SSA) 312 and/or elsewhere off-pitch from the array.

In operation, when a memory cell is being sensed (e.g., read), the voltage on one of the data lines 305-1 (D) or 305-2 (D_) will be slightly greater than the voltage on the other one of data lines 305-1 (D) or 305-2 (D_). The ACT signal 307 is then driven low and the RNL signal 328 is driven high to enable the sense amplifier 306. The data lines 305-1 (D) or 305-2 (D_) having the lower voltage will turn on one of the PMOS transistor 329-1 or 329-2 to a greater extent than the other of PMOS transistor 329-1 or 329-2, thereby driving high the data line 305-1 (D) or 305-2 (D_) having the higher voltage to a greater extent than the other data line 305-1 (D) or 305-2 (D_) is driven high.

Similarly, the data line 305-1 (D) or 305-2 (D_) having the higher voltage will turn on one of the NMOS transistor 327-1 or 327-2 to a greater extent than the other of the NMOS transistor 327-1 or 327-2, thereby driving low the data line 305-1 (D) or 305-2 (D_) having the lower voltage to a greater extent than the other data line 305-1 (D) or 305-2 (D_) is driven low. As a result, after a short delay, the data line 305-1 (D) or 305-2 (D_) having the slightly greater voltage is driven to the voltage of the supply voltage $V_{DD}$ through source transistor 311, and the other data line 305-1 (D) or 305-2 (D_) is driven to the voltage of the reference voltage (e.g., ground) through the sink transistor 313. Therefore, the cross coupled NMOS transistors 327-1 and 327-2 and PMOS transistors 329-1 and 329-2 serve as a sense amplifier pair, which amplify the differential voltage on the data lines 305-1 (D) and 305-2 (D_) and operate to latch a data value sensed from the selected memory cell.

Figure 4:
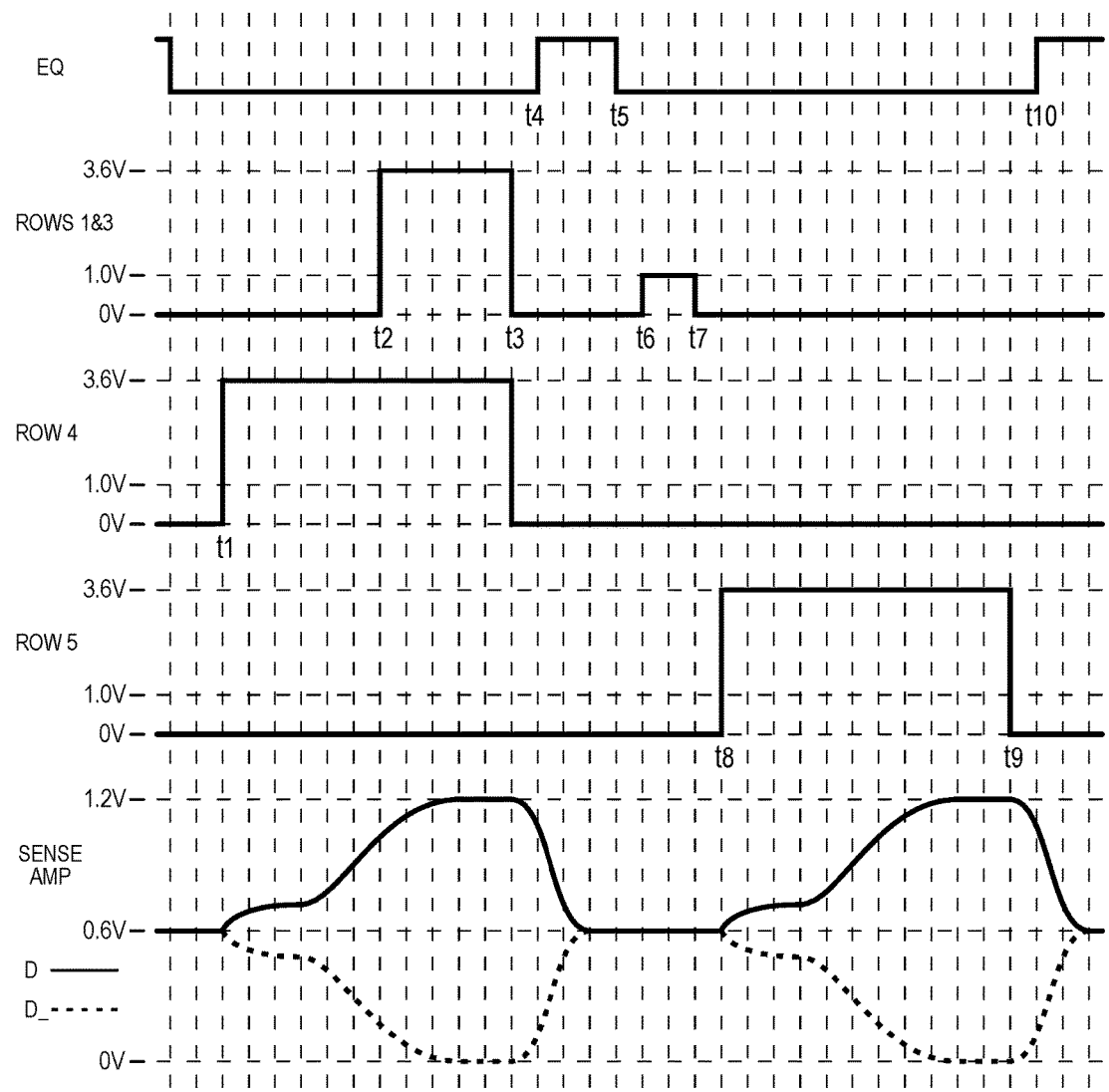
FIG. 4 illustrates a timing diagram associated with performing a number of logical operations using sensing circuitry in accordance with a number of embodiments of the present disclosure.

FIG. 4 illustrates a timing diagram associated with performing a number of logical operations using sensing circuitry in accordance with a number of embodiments of the present disclosure. Performance of logical operations (e.g., Boolean logical functions involving data values) is fundamental and commonly used. Boolean logic functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

The timing diagram illustrated in FIG. 4 is discussed with respect to the operation of circuitry shown in FIG. 2 (e.g., memory array 230, shift circuitry 223, and sensing circuitry 250). As discussed previously above, the circuitry shown in FIG. 2 includes only six (6) transistors in addition to those implementing the sense amplifier 206 corresponding to each pair of complementary data lines (e.g., 205-1 (D) and 205-2 (D_)). The additional six (6) transistors comprise the shift circuitry 223, which can be used to implement shifting (right and/or left) and inverting functionality, as previously described. No transistors are added in addition to those implementing the sense amplifier 206 to implement other logical operations (e.g., AND, OR).

As described below, the circuitry shown in FIG. 2 utilizes memory cells of the memory array 230 as an "accumulator" for operand storage during AND and OR logical operations. For example, memory cells coupled to four (4) rows in the memory array 230 can be used as the "accumulator" for operand storage during AND/OR logical operations. Utilizing the memory cells of the memory array 230 as the "accumulator" for operand storage during AND/OR logical operations takes advantage of the fact that a memory cell access device (e.g., transistor 202 shown in FIG. 2) can pass a data value having a first state (e.g., logical "0") to a data line and not pass a data value having a second state (e.g., logical "1") to the data line when the access transistor gate is in a certain voltage range.

FIG. 4 illustrates a timing diagram associated with initiating an AND logical operation. FIG. 4 shows signals for various rows (e.g., Rows 1 and 3 (operated together in this example), 4, and 5). However, implementation of the present methodology is not limited to operation of these particular rows and can be implemented using different rows. The particular timing diagram signals are discussed below with respect to the pseudo code associated with an AND operation of the circuit shown in FIG. 2.

An example of pseudo code associated with an AND logical operation is summarized below. In example, pseudo code below implements a logical AND operation involving a data value stored in a memory cell coupled to Row 4 with a data value stored in a memory cell coupled to Row 5 (e.g., Row 4 AND Row 5). However, using operands for the logical AND operation from Rows 4 and 5 are merely one example, and the present disclosure is not confined to performing logical operations on operands from only these rows (e.g., data values stored in memory cells from other rows in a memory array can be used as operands for logical operations). Logical operations can be implemented using other rows than those used in illustration below.

Copy Row 4 into Row 1 and Row 3
      Deactivate EQ
      Open Row 4
      Fire Sense Amplifier (after which Row 4 data resides in the sense amplifier)
      Open Row 1 and Row 3
      Close All Rows
      Precharge (e.g., deactivate control signals ACT and RNL in the sense amplifier)
   AND Row 4 with Row 5
      Deactivate EQ
      Open Row 1 and Row 3
      Close Row 1 and Row 3
      Open Row 5
      Fire Sense Amplifier
      Close Row 5 (or 6)
      Precharge In the pseudo code above, "Deactivate EQ" indicates that an equilibration circuitry corresponding to the sense amplifier 206 shown in FIG. 2 is deactivated prior to $t_1$ shown in FIG. 4. As was described with respect to equilibration circuitry 314 for sense amplifier 306 shown in FIG. 3, deactivation of the equilibration circuitry 314 occurs by equilibration signals EQ on control signal line 326 R going low to turn-off transistors 325-1, 225-2, and 324 such that data lines 305-1 (D) and 305-2 (D_) are not shorted together and to an equilibration voltage (e.g., $V_{DD}/2$).

After the equilibration circuitry 314 is deactivated, a selected row (e.g., Row 4) is enabled as indicated by "Open Row 4" in the pseudo code and as shown at $t_1$ for signal Row 4 in FIG. 4. When the voltage signal applied to Row 4 (e.g., 204-4 shown in FIG. 2) reaches the threshold voltage (Vt) of the access transistor corresponding to the selected cell, the access transistor turns on and couples the data line (e.g., 205-2 (D_)) to the selected cell which creates a differential voltage signal between the data lines. Typical word line voltage for a row can be, for example, 3.6 V when the power supply (e.g., $V_{DD}$) is 1.2 V. That is, word line activation voltage can be three (3) times the power supply voltage, for instance. Voltage above $V_{DD}$ can be implemented, for example, using charge pump circuitry. FIG. 4 shows the voltage on data line D rising slightly from the equilibration voltage level (e.g., $V_{DD}/2=1.2$ V/2=0.6 V) to indicate a logic "1" being stored in the memory cell coupled to Row 4.

After Row 4 is opened, in the pseudo code above, "Fire Sense amplifier" indicates that the sense amplifier 206 is enabled, as also shown at $t_1$ in FIG. 4. Firing the sense amplifier 206 loads the Row 4 data value into the sense amplifier. The sense amplifier 206 can be enabled as described with respect to sense amplifier 306 shown in FIG. 3, for example, by the ACT positive control signal going low and the RNL negative control signal going high, which amplifies the differential signal between 205-1 (D) and D_ 205-2, resulting in a voltage corresponding to a logic "1" (e.g., $V_{DD}$) or a voltage corresponding to a logic "0" (e.g., GND) being on data line 205-1 (D) (and the voltage corresponding to the other logic state being on complementary data line 205-2 (D_)). FIG. 4 shows the voltage on data line D rising to $V_{DD}$ (e.g., 1.2 V) to indicate a logic "1" being stored in the memory cell coupled to Row 4, for example. The sensed data value (e.g., Row 4) is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

After firing the sense amplifiers, in the pseudo code above, selected rows (e.g., Rows 1 and 3) are enabled as indicated by "Open Row 1 and Row 3" in the pseudo code and as shown at $t_2$ for signal Rows 1&3 in FIG. 4. Rows 1 and 3 are opened in a similar manner as that previously described with respect to opening Row 4. Opening Rows 1 and 3 stores the data value stored in the primary latch of the sense amplifier 206 (e.g., from Row 4) to memory cells coupled to Rows 1 and 3.

After the data value from Row 4 is stored into Rows 1 and 3, all rows (e.g., Rows 1, 3, and 4) are deactivated as indicated by "Close All Rows" as indicated at $t_3$ in FIG. 4 for the Rows 1&3 and Row 4 signals. Closing rows can be accomplished by the access transistor turning off to decouple the selected cell from the corresponding data line.

After all rows are closed, "Precharge" in the pseudo code above can cause a precharge of the data lines by an equilibrate operation, as shown in FIG. 4 at $t_4$. The equilibration operation can be initiated by the EQ control signal going high (e.g., on the equilibration control signal line 326 shown in FIG. 3) to turn on all transistors 325-1, 325-1, and 324 so as to short data lines 305-1 (D) and 305-2 (D_) together and to an equilibration voltage (e.g., $V_{DD}/2$). This clears the Row 4 data value from the data lines 205-1 (D) and 205-2 (D_) shown in FIG. 2. The precharge is shown in FIG. 4 by the voltages on the data lines D and D_ returning from the rails to the equilibration voltage (e.g., 0.6 V). In the pseudo code above, "Deactivate EQ" indicates that an equilibration circuitry corresponding to the sense amplifier 206 shown in FIG. 2 is deactivated as previously described above and as shown at is in FIG. 4.

With the data lines D and D_ equilibrated, Row 1 and Row 3 are opened again, as indicated by "Open Row 1 and Row 3" in the pseudo code and as shown at $t_6$ for signal Rows 1 and 3 in FIG. 4. Rows 1 and 3 are opened in a similar manner as that previously described but with the word line being charged to a voltage to which the data line is charged plus some portion of a threshold voltage of a memory cell access device (e.g., Vt). According to some embodiments, the word line is charged to within a voltage range, the voltage range being from the threshold voltage of the memory cell access device (e.g., Vt) to the threshold voltage of the memory cell access device plus the voltage to which the data lines are charged. According to various embodiments, the word line is charged to a voltage ranging from the threshold voltage of the memory cell access device (e.g., Vt) to the threshold voltage of the memory cell access device plus the equilibration voltage, to which the data lines are charged (e.g., $Vt+V_{DD}/2$). Charging the word line to a relatively higher voltage in the above-mentioned range facilitates sensing a logic "0" faster but with an increased risk of incorrectly sensing a logic "1." Charging the word line to a relatively lower voltage in the above-mentioned range slows down sensing a logic "0" but with an decreases the risk of incorrectly sensing a logic "1."

According to an example embodiment, Rows 1 and 3 are opened with the word line being charged to the equilibration voltage on the data lines plus one-half the threshold voltage of the memory cell access device (e.g., $V_{DD}/2+Vt/2$). Because data lines D and D_ were equilibrated immediately preceding opening Rows 1 and 3, the data line are at the equilibration voltage (e.g., $V_{DD}/2=0.6$ V when $V_{DD}$ is 1.2 V). Assuming Vt of the access transistor 202 shown in FIG. 2 is 0.8 V, Vt/2 is 0.4 V. Therefore, when opening Rows 1 and 3, the word lines are charged to 0.6+0.4=1.0 V for this example, as is shown at $t_6$ for signal Rows 1&3 in FIG. 4.

Opening the rows where the first operand of the AND logical operation (e.g., Row 4) data value was previously stored using the modified word line voltage results in the charge stored in the memory cells coupled to Rows 1 and 3 having no effect on the data line voltages (e.g., at equilibrate voltage) when the Row 4 data value stored in Rows 1 and 3 corresponds to a logic "1" because the voltage om the word lines of Row 1 and 3 is not sufficient to turn-on the access transistor. A Vgs (voltage gate-to-source) of at least Vt is needed for the access transistor to turn-on. According to various embodiments of the present disclosure, the access device is a MOS transistor, which can turn-on in either direction; therefore, it is the higher of the gate-to-terminal voltages that is of interest to assess whether the access device turns-on in either direction. However, with the word line (coupled to the gate of the access transistor) at 1.0 V, and the data line (coupled to the source terminal of the access transistor) at 0.6 V (e.g., equilibration voltage), the access transistor experiences a Vgs (with respect to the access device terminal coupled to the data line) of only 1.0 V−0.6 V=0.4 V, and thus remains off. Since the storage element (e.g., capacitor 203 shown in FIG. 2) is charged to a higher voltage than the equilibration voltage of the data line, the Vgs with respect to the access device terminal coupled to the storage element) is less (e.g., near 0 V in this example).

Opening Rows 1 and 3 using the above-described modified word line voltage causes the access transistor for the memory cell coupled to Row 1 and the access transistor for the memory cell coupled to Row 3 to turn-on when the Row 4 data value corresponds to a logic "0" (which was previously stored in Rows 1 and 3). If a logic "0" is stored in the memory cell, the memory cell is discharged (e.g., 0 V); therefore, with the word line being charged to 1.0 V, the Vgs of the access device is 1.0 V–0 V=1.0 V, which is above the Vt for the access transistor and it turns-on. Turning on the access transistors for the memory cells coupled to Rows 1 and 3 causes the data line voltage to decrease below the equilibrate voltage. The voltage drop is caused by the storage elements for the memory cells of Row 1 and 3 being charged by the equilibration voltage on data line, which decreases the resulting voltage of the data line D_. Effectively, the voltage on data line D_ is decreased by the effect of 2 logic zeros.

In the pseudo code above, "Close Row 1 and Row 3" indicates that Rows 1 and 3 are deactivated as previously described above for all rows, and as shown in FIG. 4 at $t_7$. According to some embodiments of the present disclosure, any row coupled to the data lines is cancelled by closing the corresponding row line prior to opening the row to which a memory cell storing the second operand of the logical operation is stored, as described immediately below.

The row storing the second operand of the logical operation (e.g., Row 5) is enabled as indicated by "Open Row 5" in the pseudo code and as shown at is for signal Row 5 in FIG. 4. Row 5 is opened in the same manner previously described for opening Row 3. If the Row 4 data value was a logic "1," normal sensing of the data value of Row 5 occurs. Recall, when the first operand of the AND logical operation is a logic "1," the data line remains at the equilibration voltage when Rows 1 and 3 are opened, as described above. Maintaining the data lines at the equilibration voltage enables the second operand of the AND logical operation to be sense normally.

When the first operand of an AND logical operation is a logic "1," the result of the AND logical operation follows the value of the second operand so that if the second operand is a logic "0" the result of the AND logical operation is also a logic "0," and if the second operand is a logic "1" the result of the AND logical operation is also a logic "1." That is, when the first operand of an AND logical operation is a logic "1," the sensed data value for the second operand is also the result of the AND logical operation. The data line voltages show in FIG. 4 illustrate the first and second operands of the AND logical operation being logic "1." With Row 5 open, firing the sense amplifier drives the logic "1" voltage om the data lines to the rails, and thereby stores the result of the AND logical operation in the Row 5 memory cell, as shown after t8 in FIG. 4 before Row 5 closes.

If the Row 4 data value was a logic "0," then the result of the AND logical operation will be a logic "0" regardless of the logic state of the Row 5 data value. Recall the discussion above when Row 1 and Row 3 are opened after the Row 4 data value was stored therein, when the Row 4 data value is a logic "0," the data line voltage is decreased from the equilibrate voltage by the effect of two zeros (e.g., one in each of two memory cells, one coupled to each of Row 1 and Row 3). Therefore, the Row 5 data value is not sensed with the data line initially being at the equilibration voltage, but rather with the data line initially being below the equilibration voltage (e.g., by two logic "0" lack-of-charges).

Because of the depressed initial data line voltage for sensing the Row 5 data value, if the Row 4 data value was a logic "0," then sensing Row 5 always results in a logic "0" being sensed, regardless of what data value was stored in Row 5. If the Row 5 data value is a logic "1," the voltage on the data line will reflect the equilibrate voltage less two logic "0" data values (from Rows 1 and 3) plus the charge of the Row 5 logic "1." The net result is that the data line will reflect the equilibrate voltage minus one "0" data value. The Row 5 "1" data value effectively cancels out one of the "0" data values from Rows 1 and 3 leaving one "0" data value from Rows 1 and 3 still modifying the voltage on the data line. A logic "0" will be sensed when the sense amp 206 fires since the data line voltage is below the equilibrate voltage at sensing.

If the Row 5 data value is a logic "0," the voltage on the data line will be decreased even further from the initial voltage below the equilibrate voltage caused by the Row 1 and 3 data values. That is, the data line voltage will correspond to the equilibration voltage minus three data values of logic "0." Again, a logic "0" will be sensed when the sense amp 206 fires since the data line voltage is well below the equilibrate voltage at sensing.

As shown in FIG. 2, the memory cell corresponding to Row 5 is coupled to data line D, as was the memory cells of Rows 1 and 3. The AND logical operation of the circuitry shown in FIG. 2 provides a correct result of the AND logical operation even if the second operand of the AND logical function is stored in an even Row (the memory cells of even rows being coupled to the complementary data line D_) where the charge in the memory cell storing the second operand will not affect data line D.

For example, if the second operand was stored in a memory cell coupled to Row 6, the Row 6 data value is sensed normally when the first operand of the AND logical operation (e.g., Row 4) is a logic "1," and the data lines remain at the equilibration voltage when Rows 1 and 3 are opened, as previously described.

If the first operand of the AND logical operation (e.g., Row 4) is a logic "0," the data line D voltage is depressed from the equilibration voltage when Rows 1 and 3 are opened, as described above. If the Row 6 data value is a logic "1," data line D_ reflects a voltage corresponding to the logic "1" when Row 6 is opened (e.g., greater than the initial equilibration voltage for data line D_ before Row 6 is opened), and data line D is charged to the equilibration voltage less the voltage decrease caused by the two logic "0" data values from Rows 1 and 3. Therefore, the sense amplifier 206 (when fired) compares the voltage on data line D (e.g., $V_{DD}/2$ minus the effect of two logic "0" data values from Rows 1 and 3) to the voltage on data line D_ (e.g., $V_{DD}/2$ plus the effect of one logic "1" data value from Row 6), resulting in a logic "0" being sensed (and stored into a memory cell coupled to Row 6).

If the Row 6 data value is a logic "0," data line D_ reflects a voltage corresponding to the logic "0" when Row 6 is opened (e.g., voltage below the equilibrate voltage by the effect of one logic "0" from Row 6), and data line D has a voltage equal to the equilibration voltage less the voltage decrease caused by the two logic "0" data values from Rows 1 and 3. Therefore, the sense amplifier 206 (when fired) compares the voltage on data line D (e.g., $V_{DD}/2$ minus the effect of two logic "0" data values from Rows 1 and 3) to the voltage on data line D_ (e.g., $V_{DD}/2$ minus the effect of one logic "0" data value from Row 6), resulting again in a logic "0" being sensed since data line D is at a lower voltage than data line D_. The appropriate AND logical operation result of a logic "0" (at least from the first operand being a logic "0") occurs, and is stored into a memory cell coupled to Row 6.

After the sense amplifier fires as described for the various scenarios discussed above, thereby storing the result of the AND logical operation into the memory cell within which the second operand of the AND logical operation was previously stored, the Row 5 (or 6) is closed in a manner previously described above for other rows, as indicated in the pseudo code and as show in FIG. 4 at $t_9$ for signal Row 5. A precharge (e.g., equilibration operation) is initiated as previously described, as indicated in the pseudo code and shown at $t_{10}$ in FIG. 4.

Figure 5:
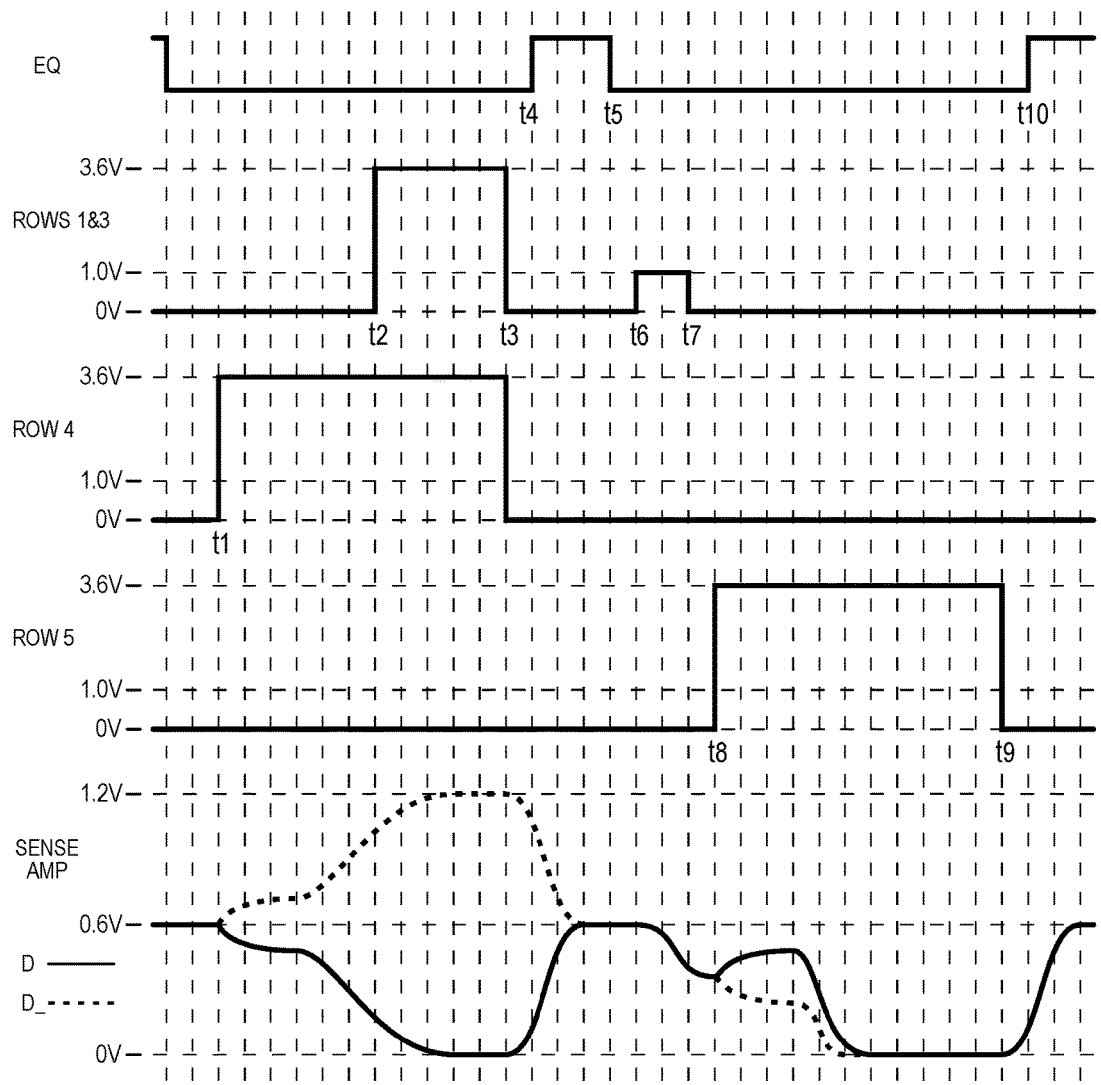
FIG. 5 illustrates a timing diagram associated with performing a number of logical operations using sensing circuitry in accordance with a number of embodiments of the present disclosure.

FIG. 5 illustrates a timing diagram associated with performing a number of logical operations using sensing circuitry in accordance with a number of embodiments of the present disclosure. FIG. 5 shows the same timing for the signals of Rows 1&3, 4, and 5 as that shown in FIG. 4. However, the data line voltages D and D_ for the sense amplifier signal reflect the first operand of the AND logical operation being a logic "0" (rather than a logic "1" as shown in FIG. 4). FIG. 5 further shows the second operand of the AND logical operation being a logic "1." As described above, the voltages of data lines D and D_ are equilibrated at $t_6$ until Rows 1 and 3 are opened at $t_8$ (e.g., after the Row 4 data value has been stored therein). Opening Rows 1 and 3 depresses the data line D voltage due to the logic "0" being stored in each from Row 4. Opening Row 5 moves the data line D voltage toward the equilibration voltage, but cannot overcome the effect of two logic "0" values from Rows 1 and 3, so the data line D voltage remains below the equilibration voltage until the sense amplifier 306 fires and drives the data line D voltage to the rails corresponding to a logic "0" until Row 5 closes at $t_9$ and an equilibration operation is initiated at $t_{10}$.

Figure 6:
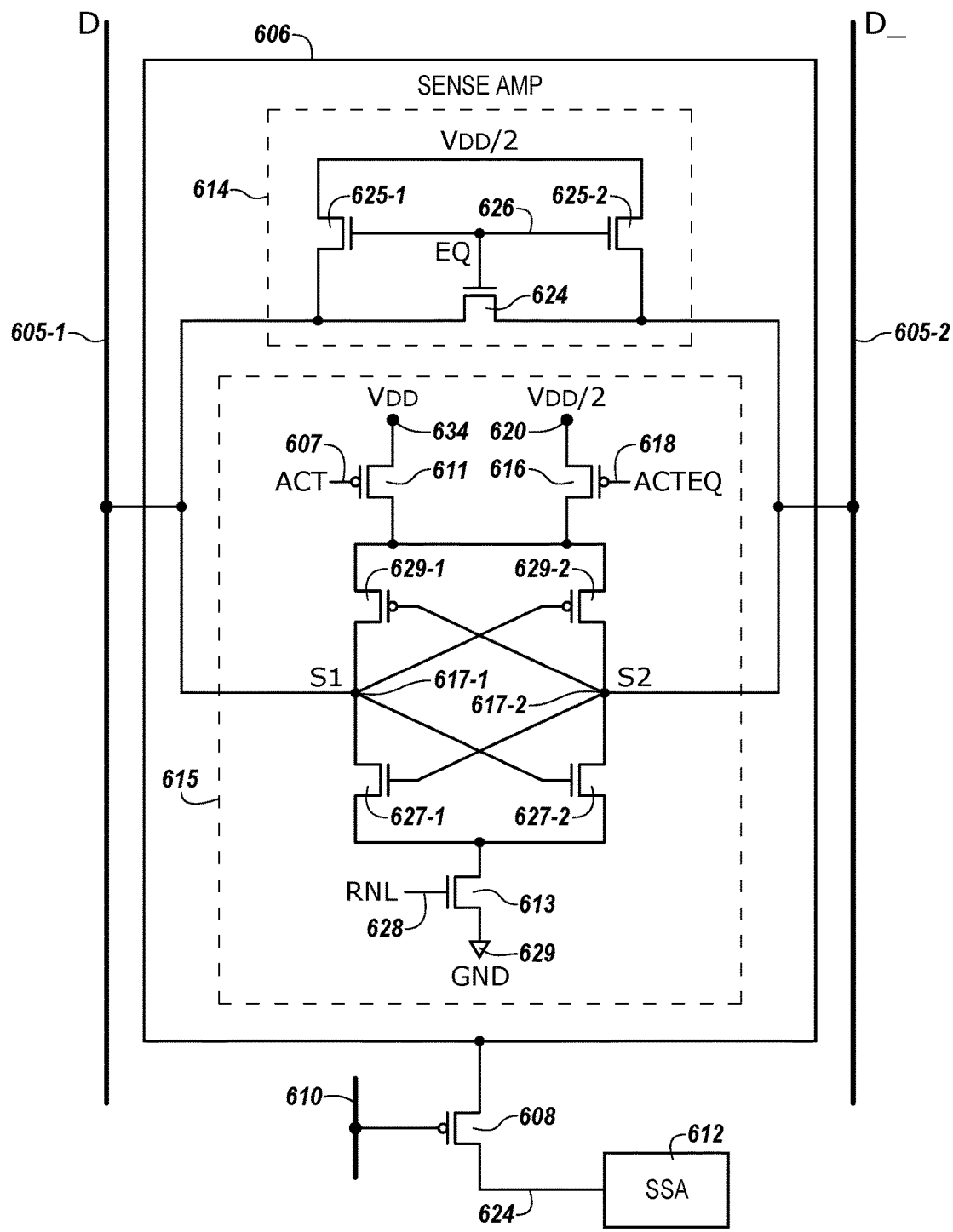
FIG. 6 is another schematic diagram illustrating a portion of sensing circuitry in accordance with a number of embodiments of the present disclosure.

FIG. 6 is another schematic diagram illustrating a portion of sensing circuitry in accordance with a number of embodiments of the present disclosure. FIG. 6 shows a sense amplifier 606 coupled to a pair of complementary data lines 605-1 (D) and 605-2 (D_). Sense amplifier 606 illustrated in FIG. 6 can correspond to sense amplifier 206 shown in FIG. 2; data line 605-1 (D) shown in FIG. 6 can correspond to data line 205-1 (D) shown in FIG. 2; and data line 605-2 (D_) shown in FIG. 6 can correspond to data line 205-2 (D_) shown in FIG. 2.

The sense amplifier 606 is similar to the sense amplifier 306 shown in FIG. 3 and can include equilibration circuitry 614 and a latch 615 (e.g., a static latch such as a cross coupled latch). As used herein, the cross coupled latch of sense amplifier 606 may be referred to as a primary latch 615. The latch 615 can include a pair of cross coupled n-channel transistors (e.g., NMOS transistor) 627-1 and 627-2 having their respective sources selectively coupled to a reference voltage (e.g., ground) through a sink transistor 613. Sink transistor 613 can be a n-channel transistor (e.g., NMOS transistors), for example. A gate of the sink transistor 613 can be coupled to a negative control signal line 628 providing a negative control signal (e.g., RNL). The cross coupled n-channel transistor 627-1 can have a drain directly coupled to a first latch node 617-1 (S1), and cross coupled n-channel transistor 627-2 can have a drain directly coupled to a second latch node 617-2 (S2). The first latch node 617-1 (S1) is coupled to data line 605-1 (D), and the second latch node 617-2 (S2) is coupled to data line 605-2 (D_).

The latch 615 can also include a pair of cross coupled p-channel transistors (e.g., PMOS transistors) 629-1 and 629-2 having their respective sources selectively coupled to a supply voltage (e.g., $V_{DD}$) through a source transistor 611. Source transistor 611 can be a p-channel transistor (e.g., PMOS transistor), for example. A gate of the source transistor 611 can be coupled to a positive control signal line 607 providing a positive control signal (e.g., ACT). Cross coupled p-channel transistor 629-1 can have a drain directly coupled to the first latch node 617-1 (S1), and cross coupled p-channel transistor 629-2 can have a drain directly coupled to the second latch node 617-2 (S2).

A gate of cross coupled n-channel transistor 627-1 and a gate of cross coupled p-channel transistor 629-1 are coupled to the second latch node 617-2 (S2). A gate of cross coupled n-channel transistor 627-2 and a gate of cross coupled p-channel transistor 629-2 are coupled to the second latch node 617-1 (S1).

Equilibration circuitry 614 can be configured to equilibrate the data lines 605-1 (D) and 605-2 (D_). In this example, the equilibration circuitry 614 comprises a transistor 624 coupled between data lines 605-1 (D) and 605-2 (D_). The equilibration circuitry 614 also comprises transistors 625-1 and 625-2 each having a first source/drain region coupled together. A second source/drain region of transistor 625-1 can be coupled data line 605-1 (D), and a second source/drain region of transistor 625-2 can be coupled data line 605-2 (D_). Gates of transistors 624, 625-1, and 625-2 can be coupled together, and coupled to an equilibration control signal line 626 providing an equilibration control signal (EQ). As such, activating EQ turns-on transistors 624, 625-1, and 625-2, which effectively shorts data lines 605-1 (D) and 605-2 (D_) together and to the an equilibration voltage (e.g., $V_{DD}/2$).

According to various embodiments, transistors 624, 625-1, 625-2, and an equilibration transistor are n-channel transistors. However, embodiments of the present invention are not limited to the transistors of the particular conductivity type provided in this example configuration. For example, opposite control signals can be used with transistors of opposite conductivity type to implement same sense amplifier functionality.

Sense amplifier 606 is different from sense amplifier 306 in FIG. 3 in that an additional ACT equilibrate transistor 616 is coupled to the source regions a pair of cross coupled p-channel transistors (e.g., PMOS transistors) 629-1 and 629-2. That is, the pair of cross coupled p-channel transistors 629-1 and 629-2 have their respective sources selectively coupled to an equilibrate voltage (e.g., $V_{DD}/2$) 620 through the ACT equilibrate transistor 616. ACT equilibrate transistor 616 can be a p-channel transistor (e.g., PMOS transistor), for example. A gate of the ACT equilibrate transistor 620 can be coupled to a positive control signal line 618 providing a positive control signal (e.g., ACT).

The sense amplifier 606 can also include additional transistors used to interface with the memory array in various ways, such as transistors having gates coupled to a column decode signal or a column select signal. And the data lines 605-1 (D) and 605-2 (D_) can be coupled to respective local I/O lines (e.g., I/O line 624) that are responsive to an enabling signal on line 610 to an access transistor 608 to perform an operation such as a data line access in association with a read operation. Such an enabling signal can be activated to transfer a signal corresponding to the state (e.g., a logic data value such as logic "0" or logic "1") of the memory cell being accessed out of the array on the I/O line 624 to a secondary sense amplifier (SSA) 612 and/or elsewhere off-pitch from the array.

In operation, when a memory cell is being sensed (e.g., read), the voltage on one of the data lines 605-1 (D) or 605-2 (D_) will be slightly greater than the voltage on the other one of data lines 605-1 (D) or 605-2 (D_). The ACT signal 607 is then driven low and the RNL signal 628 is driven high to enable the sense amplifier 606 latch 615. The data line 605-1 (D) or 605-2 (D_) having the lower voltage will turn on one of the PMOS transistor 629-1 or 629-2 to a greater extent than the other of PMOS transistor 629-1 or 629-2, thereby driving high the data line 605-1 (D) or 605-2 (D_). This data line 605-1 (D) or 605-2 (D_) will have a higher voltage from its connection to voltage supply (Vdd) through ACT transistor 611.

Similarly, the data line 605-1 (D) or 605-2 (D_) having the higher voltage will turn on one of the NMOS transistor 627-1 or 627-2 to a greater extent than the other of the NMOS transistor 627-1 or 627-2, thereby driving low the data line 605-1 (D) or 605-2 (D_). This data line 605-1 (D) or 605-2 (D_) will have a lower voltage coupled thereto from its connection to ground (GND) through RNL transistor 613. As a result, after a short delay, the data line 605-1 (D) or 605-2 (D_) having the slightly greater voltage is driven to the voltage of the supply voltage $V_{DD}$ through ACT (source) transistor 611, and the other data line 605-1 (D) or 605-2 (D_) is driven to the voltage of the reference voltage (e.g., ground) through the RNL (sink) transistor 613. Therefore, the cross coupled NMOS transistors 627-1 and 627-2 and PMOS transistors 629-1 and 629-2 serve as a sense amplifier pair, which amplify the differential voltage on the data lines 605-1 (D) and 605-2 (D_) and operate to latch a data value sensed from the selected memory cell.

Alternatively, activation of ACT equilibrate transistor 616 in response to an ACTEQ signal 618 will short the source regions for cross coupled p-channel transistors 629-1 and 629-2 to the equilibrate voltage (e.g., Vdd/2) 620.

Figure 7:
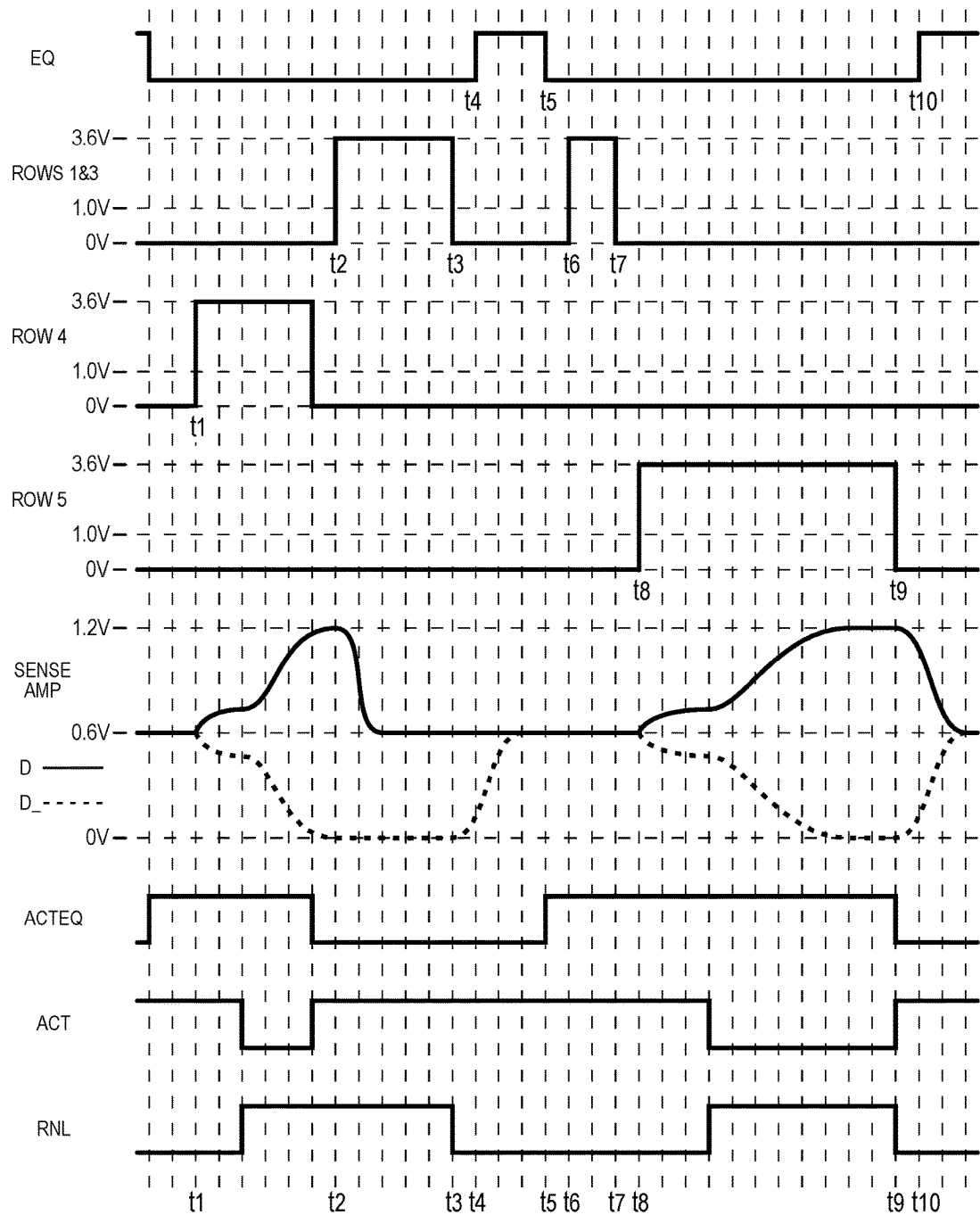
FIG. 7 illustrates a timing diagram associated with performing a number of logical operations using sensing circuitry in accordance with a number of embodiments of the present disclosure.

FIG. 7 illustrates a timing diagram associated with initiating an AND logical operation using the sense amplifier 606 shown in FIG. 6. FIG. 7 shows signals for various rows Rows 1, 3 (operated together in this example), 4, and 5. However, implementation of the present methodology is not limited to operation of these particular rows and can be implemented using different rows. The particular timing diagram signals are discussed below with respect to the pseudo code associated with an AND operation of the circuit shown in FIG. 2.

An example of pseudo code associated with an AND logical operation is summarized below. In example, pseudo code below implements a logical AND operation involving a data value stored in a memory cell coupled to Row 4 with a data value stored in a memory cell coupled to Row 5 (e.g., Row 4 AND Row 5). However, using operands for the logical AND operation from Rows 4 and 5 are merely one example, and the present disclosure is not confined to performing logical operations on operands from only these rows (e.g., data values stored in memory cells from other rows in a memory array can be used as operands for logical operations). Logical operations can be implemented using other rows than those used in illustration below.

Copy Row 4 into Row 1 and Row 3
      Deactivate EQ
      Sense amplifier deactivated (e.g., ACT is high, RNL is low)
      ACTEQ signal deactivated
   Open Row 4
   Fire Sense Amplifier (e.g., activate control signals ACT and RNL in the sense amplifier-after which Row 4 data resides in the sense amplifier)
   Close Row 4
   Activate ACTEQ signal
   Open Row 1 and Row 3
   Close Rows 1 and 3
   Precharge (e.g., deactivate control signals ACT and RNL in the sense amplifier-activate EQ ($t_4$))
   AND Row 4 with Row 5
      Deactivate EQ
      Deactivate ACTEQ signal
      Open Row 1 and Row 3
      Close Row 1 and Row 3
      Open Row 5
      Fire Sense Amplifier
      Close Row 5 (or 6)
      Activate ACTEQ
      Precharge In the pseudo code above, "Deactivate EQ" indicates that an equilibration circuitry corresponding to the sense amplifier 206 shown in FIG. 2 is deactivated prior to $t_1$ shown in FIG. 7. Also shown is that "ACTEQ" signal is high decoupling the equilibration voltage signal ($V_{DD}/2$) from the source regions of p-channel transistors 629-1 and 629-2 prior to $t_1$ shown in FIG. 7. As was described with respect to equilibration circuitry 614 for sense amplifier 606 shown in FIG. 6, deactivation of the equilibration circuitry 614 occurs by equilibration signals EQ on control signal line 626 R going low to turn-off transistors 625-1, 625-2, and 624 such that data lines 605-1 (D) and 605-2 (D_) are not shorted together and to an equilibration voltage (e.g., $V_{DD}/2$). Deactivation of the ACTEQ signal occurs by ACTEQ signal on control signal line 618 going high to turn-off transistor 616 such that the source regions for p-channel transistors 629-1 and 629-2 are not shorted together and to an equilibration voltage (e.g., $V_{DD}/2$).

After the equilibration circuitry 614 is deactivated, and the ACTEQ equilibration transistor 616 is deactivated, a selected row (e.g., Row 4) is enabled as indicated by "Open Row 4" in the pseudo code and as shown at ti for signal Row 4 in FIG. 7. When the voltage signal applied to Row 4 (e.g., 204-4 shown in FIG. 2) reaches the threshold voltage (Vt) of the access transistor corresponding to the selected cell, the access transistor turns on and couples the data line (e.g., 205-2 (D_)) to the selected cell which creates a differential voltage signal between the data lines. Typical word line voltage for a row can be, for example, 3.6 V when the power supply (e.g., $V_{DD}$) is 1.2 V. That is, word line activation voltage can be three (3) times the power supply voltage, for instance. Voltage above $V_{DD}$ can be implemented, for example, using charge pump circuitry. FIG. 7 shows the voltage on data line D rising slightly from the equilibration voltage level (e.g., $V_{DD}/2=1.2V/2=0.6$ V) to indicate a logic "1" being stored in the memory cell coupled to Row 4.

After Row 4 is opened, in the pseudo code above, "Fire Sense amplifier" indicates that the sense amplifier 206 is enabled, as also shown at $t_1$ in FIG. 7. Firing the sense amplifier 206 loads the Row 4 data value into the sense amplifier. The sense amplifier 206 can be enabled as described with respect to sense amplifier 606 shown in FIG. 6, for example, by the ACT positive control signal going low and the RNL negative control signal going high, which amplifies the differential signal between 605-1 (D) and D_ 605-2, resulting in a voltage corresponding to a logic "1" (e.g., $V_{DD}$) or a voltage corresponding to a logic "0" (e.g., GND) being on data line 205-1 (D) (and the voltage corresponding to the other logic state being on complementary data line 205-2 (D_)). FIG. 7 shows the voltage on data line D rising to $V_{DD}$ (e.g., 1.2 V) to indicate a logic "1" being stored in the memory cell coupled to Row 4, for example. The sensed data value (e.g., Row 4) is stored in the primary latch of sense amplifier 206. The primary energy consumption occurs in charging the data lines (e.g., 205-1 (D) or 205-2 (D_)) from the equilibration voltage $V_{DD}/2$ to the rail voltage $V_{DD}$.

After firing the sense amplifiers, Row 4 is then closed as shown in the pseudo code above. At this time the ACTEQ signal 618 of equilibration transistor 616 is activated to short the source regions of p-channel transistors 629-1 and 629-2 together and couple them to an equilibrate voltage 620 ($V_{DD}/2$). As shown in FIG. 6 the equilibration transistor 616 can be a p-channel transistor such that the equilibration transistor 616 is activated by the ACTEQ signal 618 going low. Likewise the ACT signal is deactivated, going high as shown in FIG. 7.

While the ACTEQ signal remains activated, selected rows (e.g., Rows 1 and 3) are enabled as indicated by "Open Row 1 and Row 3" in the pseudo code and as shown at $t_2$ for signal Rows 1 and 3 in FIG. 7. Rows 1 and 3 are opened in a similar manner as that previously described with respect to opening Row 4. Opening Rows 1 and 3 stores the data value stored in the primary latch of the sense amplifier 206 (e.g., from Row 4) to memory cells coupled to Rows 1 and 3. If the data value is a logic "0", 0.0 Volts is stored to the memory cells of Rows 1 and 3. If the data value is a logic "1", the equilibrated voltage (e.g., 0.6 Volts) is stored to the memory cells of Rows 1 and 3 instead of a typical 1.0 or more voltage.

After the data value from Row 4 is stored into Rows 1 and 3, Rows 1 and 3 are deactivated as indicated by "Close Rows 1 and 3" and as indicated at $t_3$ in FIG. 7 for the Rows 1 and 3 signals. Closing rows can be accomplished by turning off the access transistor to decouple the selected cell from the corresponding data line.

After all rows 1 and 3 are closed, and while the ACTEQ signal remains activated, "Precharge" in the pseudo code above can cause a precharge of the data lines by an equilibrate operation, as shown in FIG. 7 at $t_4$. The equilibration operation can be initiated by the EQ control signal (on the equilibration control signal line 626 shown in FIG. 6) going high to turn on all transistors 625-1, 625-1, and 624 so as to short data lines 605-1 (D) and 605-2 (D_) together and to an equilibration voltage (e.g., $V_{DD}/2$). This clears the Row 4 data value from the data line and 205-2 (D_) shown in FIG. 2. The precharge is shown in FIG. 7 by the voltages on the data line D_ returning from the rail to the equilibration voltage (e.g., 0.6 V).

In the pseudo code above, "Deactivate EQ" indicates that an equilibration circuitry corresponding to the sense amplifier 206 shown in FIG. 2 is deactivated as previously described above, and as shown at is in FIG. 7. Additionally, in the pseudo code above, "Deactivate ACTEQ" indicates that equilibration transistor 616 also returns to a high ACTEQ signal on ACTEQ signal line 618 to turn off the equilibration transistor 616 and decoupling the source regions of p-channel transistors 629-1 and 629-2 in the sense amplifier 606 from an equilibration voltage (e.g., $V_{DD}/2$).

With the data lines D and D_ and the source regions of p-channel transistors 629-1 and 629-2 in the sense amplifier 606 equilibrated, Row 1 and Row 3 are opened again, as indicated by "Open Row 1 and Row 3" in the pseudo code and as shown at $t_6$ for signal Rows 1 and 3 in FIG. 7. Rows 1 and 3 are opened in a similar manner as that previously described, e.g., with 3.6V applied, as is shown at $t_6$ for signal Rows 1 and 3 in FIG. 7.

Opening the rows where the first operand of the AND logical operation (e.g., Row 4) data value was previously stored, and having the source regions of p-channel transistors 629-1 and 629-2 in the sense amplifier 606 equilibrated, results in the charge stored in the memory cells coupled to Rows 1 and 3 having no effect on the data line voltages (e.g., at equilibrate voltage) when the Row 4 data value stored in Rows 1 and 3 corresponds to a logic "1" because the logic "1" stored in Rows 1 and 3 is at substantially the same voltage as that to which the data line is equilibrated (e.g., 0.6V).

In contrast, however, opening Rows 1 and 3, having the source regions of p-channel transistors 629-1 and 629-2 in the sense amplifier 606 equilibrated, causes the access transistor for the memory cell coupled to Row 1 and the access transistor for the memory cell coupled to Row 3 to turn-on when the Row 4 data value corresponds to a logic "0" (which was previously stored in Rows 1 and 3). If a logic "0" is stored in the memory cell, the memory cell is discharged (e.g., 0 V). Therefore, with the word line being charged to 3.6V, the Vgs of the access device is 3.6 V−0 V=3.6 V, which is above the Vt for the access transistor and it turns-on. Turning on the access transistors for the memory cells coupled to Rows 1 and 3 causes the data line voltage to decrease below the equilibrate voltage. The voltage drop is caused by the storage elements for the memory cells of Row 1 and 3 being charged by the equilibration voltage on data line, which decreases the resulting voltage of the data line D_. Effectively, the voltage on data line D_ is decreased by the effect of 2 logic zeros.

In the pseudo code above, "Close Row 1 and Row 3" indicates that Rows 1 and 3 are deactivated as previously described above for rows 1 and 3, and as shown in FIG. 7 at $t_7$. According to some embodiments of the present disclosure, any row coupled to the data lines is cancelled by closing the corresponding row line prior to opening the row to which a memory cell storing the second operand of the logical operation is stored, as described immediately below.

The row storing the second operand of the logical operation (e.g., Row 5) is enabled as indicated by "Open Row 5" in the pseudo code and as shown at is for signal Row 5 in FIG. 7. Row 5 is opened in the same manner previously described for opening Row 3. If the Row 4 data value was a logic "1," normal sensing of the data value of Row 5 occurs. Recall, when the first operand of the AND logical operation is a logic "1," the data line remains at the equilibration voltage when Rows 1 and 3 are opened, as described above. Maintaining the data lines at the equilibration voltage enables the second operand of the AND logical operation to be sensed normally.

When the first operand of an AND logical operation is a logic "1," the result of the AND logical operation follows the value of the second operand so that if the second operand is a logic "0" the result of the AND logical operation is also a logic "0," and if the second operand is a logic "1" the result of the AND logical operation is also a logic "1." That is, when the first operand of an AND logical operation is a logic "1," the sensed data value for the second operand is also the result of the AND logical operation. The data line voltages show in FIG. 7 illustrate the first and second operands of the AND logical operation being logic "1." With Row 5 open, firing the sense amplifier drives the logic "1" voltage om the data lines to the rails, and thereby stores the result of the AND logical operation in the Row 5 memory cell, as shown after t₈ in FIG. 7 before Row 5 closes.

By contrast, if the Row 4 data value was a logic "0," then the result of the AND logical operation will be a logic "0" regardless of the logic state of the Row 5 data value. Recall the discussion above when Row 1 and Row 3 are opened after the Row 4 data value was stored therein, when the Row 4 data value is a logic "0," the data line voltage is decreased from the equilibrate voltage by the effect of two zeros (e.g., one in each of two memory cells, one coupled to each of Row 1 and Row 3). Therefore, the Row 5 data value is not sensed with the data line initially being at the equilibration voltage, but rather with the data line initially being below the equilibration voltage (e.g., by two logic "0" lack-of-charges).

Because of the depressed initial data line voltage for sensing the Row 5 data value, if the Row 4 data value was a logic "0," then sensing Row 5 always results in a logic "0" being sensed, regardless of what data value was stored in Row 5. If the Row 5 data value is a logic "1," the voltage on the data line will reflect the equilibrate voltage less two logic "0" data values (from Rows 1 and 3) plus the charge of the Row 5 logic "1." The net result is that the data line will reflect the equilibrate voltage minus one "0" data value. The Row 5 "1" data value effectively cancels out one of the "0" data values from Rows 1 and 3 leaving one "0" data value from Rows 1 and 3 still modifying the voltage on the data line. A logic "0" will be sensed when the sense amp 206 fires since the data line voltage is below the equilibrate voltage at sensing.

If the Row 5 data value is a logic "0," the voltage on the data line will be decreased even further from the initial voltage below the equilibrate voltage caused by the Row 1 and 3 data values. That is, the data line voltage will correspond to the equilibration voltage minus three data values of logic "0." Again, a logic "0" will be sensed when the sense amp 206 fires since the data line voltage is well below the equilibrate voltage at sensing.

As shown in FIG. 2, the memory cell corresponding to Row 5 is coupled to data line D, as was the memory cells of Rows 1 and 3. However, the AND logical operation of the circuitry shown in FIG. 2 provides a correct result of the AND logical operation even if the second operand of the AND logical function is stored in an even Row (the memory cells of even rows being coupled to the complementary data line D_) where the charge in the memory cell storing the second operand will not affect data line D.

For example, if the second operand was stored in a memory cell coupled to Row 6, the Row 6 data value is sensed normally when the first operand of the AND logical operation (e.g., Row 4) is a logic "1," and the data lines remain at the equilibration voltage when Rows 1 and 3 are opened, as previously described.

If the first operand of the AND logical operation (e.g., Row 4) is a logic "0," the data line D voltage is depressed from the equilibration voltage when Rows 1 and 3 are opened, as described above. If the Row 6 data value is a logic "1," data line D_ reflects a voltage corresponding to the logic "1" when Row 6 is opened (e.g., greater than the initial equilibration voltage for data line D_ before Row 6 is opened), and data line D is charged to the equilibration voltage less the voltage decrease caused by the two logic "0" data values from Rows 1 and 3. Therefore, the sense amplifier 206 (when fired) compares the voltage on data line D (e.g., $V_{DD}/2$ minus the effect of two logic "0" data values from Rows 1 and 3) to the voltage on data line D_ (e.g., $V_{DD}/2$ plus the effect of one logic "1" data value from Row 6), resulting in a logic "0" being sensed (and stored into a memory cell coupled to Row 6).

If the Row 6 data value is a logic "0," data line D_ reflects a voltage corresponding to the logic "0" when Row 6 is opened (e.g., voltage below the equilibrate voltage by the effect of one logic "0" from Row 6), and data line D has a voltage equal to the equilibration voltage less the voltage decrease caused by the two logic "0" data values from Rows 1 and 3. Therefore, the sense amplifier 206 (when fired) compares the voltage on data line D (e.g., $V_{DD}/2$ minus the effect of two logic "0" data values from Rows 1 and 3) to the voltage on data line D_ (e.g., $V_{DD}/2$ minus the effect of one logic "0" data value from Row 6), resulting again in a logic "0" being sensed since data line D is at a lower voltage than data line D_. The appropriate AND logical operation result of a logic "0" (at least from the first operand being a logic "0") occurs, and is stored into a memory cell coupled to Row 6.

After the sense amplifier fires as described for the various scenarios discussed above, thereby storing the result of the AND logical operation into the memory cell within which the second operand of the AND logical operation was previously stored, the Row 5 (or 6) is closed in a manner previously described above for other rows, as indicated in the pseudo code and as show in FIG. 7 at t₉ for signal Row 5. At t₉, the sense amplifier is deactivated and the ACTEQ equilibration transistor 616 is activated by the ACTEQ signal 618 going low. A precharge (e.g., equilibration operation) is also initiated as previously described, as indicated in the pseudo code and shown at t₁₀ in FIG. 7.

Figure 8:
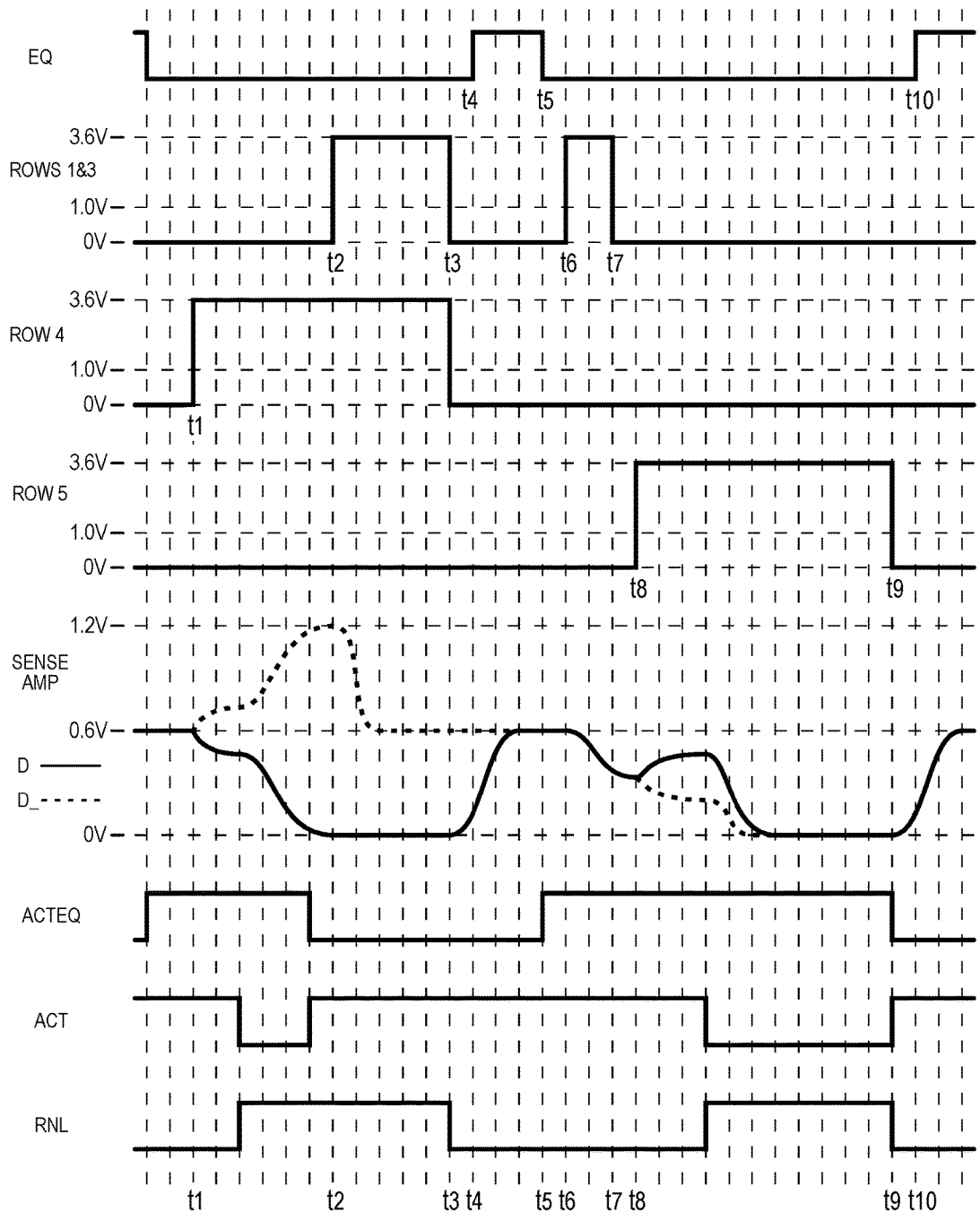
FIG. 8 illustrates a timing diagram associated with performing a number of logical operations using sensing circuitry in accordance with a number of embodiments of the present disclosure.

FIG. 8 illustrates a timing diagram associated with performing a number of logical operations using sensing circuitry in accordance with a number of embodiments of the present disclosure. FIG. 8 shows the same timing for the signals of Rows 1, 3, 4, and 5 as that shown in FIG. 7. However, the data line voltages D and D_ for the sense amplifier signal reflect the first operand of the AND logical operation being a logic "0" (rather than a logic "1" as shown in FIG. 7). FIG. 8 further shows the second operand (Row 5) of the AND logical operation being a logic "1." As described above, the voltages of data lines D and D_ are equilibrated at t₄, and the source regions of p-channel transistors 629-1 and 629-2 in the sense amplifier 606 are equilibrated up until t₅, until Rows 1 and 3 are opened at t₆ (e.g., after the Row 4 data value has been stored therein). Opening Rows 1 and 3 depresses the data line D voltage due to the logic "0" being stored in each from Row 4. Opening Row 5 moves the data line D voltage toward the equilibration voltage, but cannot overcome the effect of two logic "0" values from Rows 1 and 3, so the data line D voltage remains below the equilibration voltage until the sense amplifier 606 fires, as described above, and drives the data line D voltage to the rails corresponding to a logic "0" until Row 5 closes at t₉. At t₉, the sense amplifier 606 is deactivated and the ACTEQ equilibration transistor 616 is activated by the ACTEQ signal 618 going low. A precharge (e.g., equilibration operation) is also initiated as previously described, as indicated in the pseudo code and shown at t₁₀ in FIG. 7.

An OR logical operation can be accomplished similar to that described for the AND logical operation using data values from complement Rows 0 and 2 instead of True Rows 1 and 3 (assuming the access devices of Row 0 and Row 1 are operated together, firing the sense amplifier 206 stores the true data value in the memory cell coupled to Row 1 and a complement of the data value in the memory cell coupled to Row 0).

For an OR logical operation, where the first operand is a logic "1" the result of the OR logical operation is always a logic "1" regardless of the data value of the second operand. When the first operand of an OR logical operation is a logic "0," the result of the OR logical operation follows the data value of the second operand (e.g., the result of the OR logical operation is a logic "1" when the second operand is a logic "1," the result of the OR logical operation is a logic "0" when the second operand is also a logic "0"). Therefore, using the complement data values causes the circuitry shown in FIG. 2 to operate in the same manner as described above for the AND logical operation to reach the correct result for the OR logical operation.

According to other embodiments of the present disclosure, rather than using a complement data value stored in a memory cell coupled to the complement data line, the invert isolation transistors (e.g., 221-5 and 221-6 shown in FIG. 2) can be used to transpose the true data values in operating, which cause the same operations as described for the AND logical operation.

While example embodiments including various combinations and configurations of sensing circuitry, sense amplifiers, memory cells of a memory array coupled to particular rows, and/or shift circuitry have been illustrated and described herein, embodiments of the present disclosure are not limited to those combinations explicitly recited herein. Other combinations and configurations of the sensing circuitry, sense amplifiers, memory cells, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
    a host; and
    a memory device coupled to the host and comprising an array of memory cells and corresponding sensing circuitry configured to perform logical operations between operands stored in memory cells corresponding to a same column and coupled to different access lines, without transferring the operands to the host, by using the array as an accumulator.

2. The system of claim 1, wherein the host comprises a processor external to the memory device, and wherein the memory device comprises a processor in memory device.

3. The system of claim 1, wherein the memory device comprises a controller coupled to the array and to the sensing circuitry.

4. The system of claim 1, wherein the memory device is configured to perform at least one logical operation by copying a data value corresponding to a first operand stored in a memory cell and coupled to a first access line into two different memory cells coupled to respective different access lines by simultaneously activating the respective different access lines.

5. The system of claim 1, wherein the memory device is configured to perform a logical operation between a first operand stored in a first memory cell coupled to a first access line and a second operand stored in a second memory cell coupled to a second access line by modifying a voltage of a sense line corresponding to the column to an extent that a charge of the second memory cell storing the second operand is not sufficient to change a data value represented by the modified voltage of the sense line.

6. The system of claim 1, wherein the memory device is configured to perform a logical operation between a first operand stored in a first memory cell coupled to a first access line and a second operand stored in a second memory cell coupled to a second access line by:
    applying, to a plurality of access lines, a voltage:
        sufficient to cause access devices coupled thereto to be turned-on responsive to memory cells to which the access devices correspond storing a particular data value; and
        insufficient to cause the access devices coupled thereto to be turned-on responsive to memory cells of the array to which the access devices correspond storing a different particular data value; and
    coupling a memory cell storing a charge corresponding to the first operand to a sense line corresponding to the column after applying the voltage to the plurality of access without performing an equilibration operation after applying the voltage to the plurality of access lines.

7. The system of claim 1, wherein the array comprises DRAM cells.

8. The system of claim 1, wherein the memory device is configured to perform at least one logical operation between operands stored in memory cells corresponding to a same column and coupled to different access lines by:
    storing a first charge corresponding to a first operand of the logical operation in a plurality of memory cells corresponding to the column;
    charging access lines corresponding to the plurality of the memory cells to a voltage to which a sense line corresponding to the column is charged plus some portion of a threshold voltage of a memory cell access device;
    isolating the plurality of memory cells from the sense line;
    coupling of a memory cell storing a charge corresponding to a second operand of the logical operation to the sense line; and
    sensing of a voltage of the sense line to yield a result of the logical operation.

9. A system, comprising:
a host; and
a memory device coupled to the host and configured to perform a logical operation between a first operand stored in a memory cell of an array and a second operand stored in a memory cell of the array without transferring the operands to the host by:
- charging multiple access lines corresponding to the array to within a voltage to which a sense line is charged plus some portion of a threshold voltage of a memory cell access device coupled to the sense line and to one of the multiple access lines; and
- modifying the sense line voltage with a charge stored in a memory cell coupled to the sense line and to an access line other than the multiple access lines, the charge stored in the memory cell corresponding to one of the first operand and the second operand of the logical operation, the modified voltage of the sense line indicating a result of the logical operation.

10. The system of claim 9, wherein the memory device comprises a processing in memory device, and wherein the host is external to the memory device.

11. The system of claim 9, wherein the array is used as an accumulator in association with performing the logical operation.

12. The system of claim 9, wherein the first and second memory cells are coupled to different access lines and correspond to a same column of the array.

13. The system of claim 12, wherein the sense line is one of a pair of complementary sense lines corresponding to the same column.

14. The system of claim 9, wherein the memory device is configured to perform the logical operation by equilibrating the sense line to an equilibrate voltage prior to charging the multiple access lines, wherein charging the multiple access lines includes charging the multiple access lines to the equilibrate voltage.

15. The system of claim 9, wherein the memory device is configured to perform the logical operation by equilibrating the sense line to about one half of a supply voltage prior to charging the multiple access lines, wherein charging the multiple access lines includes charging the multiple access lines to about one half of the supply voltage.

16. The system of claim 9, wherein the memory device is configured to perform the logical operation by charging the multiple access lines to a voltage within a range from the threshold voltage of the memory cell access device to the threshold voltage of the memory cell access device plus a voltage to which the sense line is charged.

17. The system of claim 9, wherein the memory device is configured to perform the logical operation by charging the different access lines to a voltage within a range from the threshold voltage of the memory cell access device to the threshold voltage of the memory cell access device plus a sense line equilibration voltage.

18. A method, comprising:
receiving, at a memory device, instructions from a host; and
executing the instructions on the memory device, wherein executing the instructions comprises performing at least one logical operation between operands stored in memory cells corresponding to a same column and coupled to different access lines of an array, without transferring the operands to the host, by using the array as an accumulator.

19. The method of claim 18, wherein performing the at least one logical operation comprises:
- storing a first charge corresponding to a first operand of the at least one logical operation to a plurality of memory cells corresponding to the same column;
- charging access lines coupled to the plurality of the memory cells to a voltage to which a sense line corresponding to the same column is charged plus some portion of a threshold voltage of a memory cell access device;
- isolating the plurality of memory cells from the sense line;
- coupling a memory cell storing a charge corresponding to a second operand of the at least one logical operation to one of the sense line and a complementary sense line corresponding to the same column; and
- sensing a voltage of the sense line to determine a result of the at least one logical operation.

20. The method of claim 18, wherein performing the at least one logical operation comprises:
- storing a first charge corresponding to a complement of a first operand of the at least one logical operation to a plurality of memory cells corresponding to the same column;
- charging access lines coupled to the plurality of the memory cells to an equilibration voltage to which a sense line corresponding to the same column is charged plus some portion of a threshold voltage of a memory cell access device;
- isolating the plurality of memory cells from the sense line;
- coupling a memory cell storing a charge corresponding to a complement of a second operand of the at least one logical operation to one of the sense line and a complementary sense line corresponding to the same column; and
- sensing a voltage of the sense line to determine a result of the at least one logical operation.

* * * * *